(12) United States Patent
Hosoi et al.

(10) Patent No.: US 7,236,388 B2
(45) Date of Patent: Jun. 26, 2007

(54) DRIVING METHOD OF VARIABLE RESISTANCE ELEMENT AND MEMORY DEVICE

(75) Inventors: Yasunari Hosoi, Fukuyama (JP); Yukio Tamai, Tsuchiura (JP); Kazuya Ishihara, Kurashiki (JP); Shinji Kobayashi, Nara (JP); Nobuyoshi Awaya, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 106 days.

(21) Appl. No.: 11/169,535

(22) Filed: Jun. 28, 2005

(65) Prior Publication Data

US 2006/0002174 A1 Jan. 5, 2006

(30) Foreign Application Priority Data

Jun. 30, 2004 (JP) ............................. 2004-194799

(51) Int. Cl.
*G11C 11/00* (2006.01)
(52) U.S. Cl. .................... 365/148; 365/158; 365/107
(58) Field of Classification Search ................ 365/148, 365/158; 257/107
See application file for complete search history.

(56) References Cited

U.S. PATENT DOCUMENTS

| 6,204,139 B1 | 3/2001 | Liu et al. |
| 6,850,429 B2 * | 2/2005 | Rinerson et al. ............ 365/158 |
| 2003/0156445 A1 | 8/2003 | Zhuang et al. |
| 2005/0151156 A1 * | 7/2005 | Wu et al. .................... 257/107 |

FOREIGN PATENT DOCUMENTS

| EP | 1 486 985 A2 | 12/2004 |
| EP | 1 486 985 A3 | 12/2004 |
| EP | 1 507 297 A2 | 2/2005 |
| WO | WO-2005/059921 A1 | 6/2005 |

OTHER PUBLICATIONS

Liu, S.Q. et al. (May 8, 2000). "Electric-Pulse-Induced Reversible Resistance Change Effect In Magnetoresistive Films," *Applied Physics Letters* 76(19):2749-2751.
European Search Report mailed on Nov. 4, 2005 for European Patent Application No. 05254028.3, 4 pages.

(Continued)

*Primary Examiner*—Huan Hoang
(74) *Attorney, Agent, or Firm*—Morrison & Foerster LLP

(57) ABSTRACT

A variable resistance element is configured to be provided with a perovskite-type oxide between a first electrode and a second electrode, of which electric resistance between the first electrode and the second electrode is changed by applying a voltage pulse of a predetermined polarity between the first electrode and the second electrode, and the variable resistance element has a resistance hysteresis characteristic, in which a changing rate of a resistance value is changed from positive to negative with respect to increase of a cumulative pulse applying time in the application of the voltage pulse. The voltage pulse is applied to the variable resistance element so that the cumulative pulse applying time is not longer than a specific cumulative pulse applying time, in which the changing rate of the, resistance value is changed from positive to negative with respect to increase of the cumulative pulse applying time in the resistance hysteresis characteristic.

19 Claims, 17 Drawing Sheets

OTHER PUBLICATIONS

Zhuang, W.W. et al. (Dec. 8-11, 2002). "Novell Colossal Magnetoresistive Thin Film Nonvolatile Resistance Random Access Memory (RRAM)," *IEDM Technical Digest*, International Electron Devices Meeting 2002, San Francisco, CA, pp. 193-196.

Chen, Y-C. et al. (2003). "An Access-Transistor-Free (OT/1R) Non-Volatile Resistance Random Access Memory (RRAM) Using a Novel Threshold Switching, Self-Rectifying Chalcogenide Device," *IEEE*, pp. 37.4.1-37.4.4.

* cited by examiner

DRIVING METHOD OF VARIABLE RESISTANCE ELEMENT AND MEMORY DEVICE

CROSS REFERENCE TO RELATED APPLICATION

This Nonprovisional application claims priority under 35 U.S.C. §119(a) on Patent Application No. 2004-194799 filed in Japan on Jun. 30, 2004, the entire contents of which are hereby incorporated by reference.

BACKGROUND OF THE INVENTION

1. Field of the Invention

The present invention relates to a driving method of a variable resistance element including a perovskite-type oxide between a first electrode and a second electrode, of which electric resistance is changed by applying a voltage pulse of a predetermined polarity between the both electrodes, and a memory device provided with the variable resistance element.

2. Description of the Related Art

In recent years, as a next-generation Nonvolatile Random Access Memory (NVRAM) capable of being operated at a high speed in place of a flash memory, various device structures such as a Ferroelectric RAM (FeRAM), a Magnetic RAM (MRAM), and an Ovonic Unified Memory (OUM) or the like are proposed and in view of a high performance, a high reliability, a low cost, and a process matching, competition in development of them has been intensified. However, these current memory devices have both merits and demerits respectively and it is difficult to realize the ideal "universal memory" having each merit of a SRAM, a DRAM, and the flash memory.

On the contrary to these existing arts, a method of changing an electric resistance in a reversible fashion by applying a voltage pulse to a perovskite material that is known as a supergiant magnetic resistance effect is disclosed by Shangquing Liu and Alex Ignatiev et al. of University of Houston (refer to the specification of U.S. Pat. No. 6,204,139, Liu, S. Q. et al., "Electric-pulse-induced reversible Resistance change effect in magnetoresistive films", Applied Physics Letter, Vol., 76, pp. 2749-2751, 2000). This is very epoch-making because the resistance change across several digits appears even at room temperature without applying a magnetic field while using the perovskite material that is known as the supergiant magnetic resistance effect. A Resistive Random Access Memory (RRAM) does not require any magnetic field differently from the MRAM, so that this has an excellent advantage such that the power consumption is very low, minuteness and high integration can be easily realized, and multilevel storage is possible since a dynamic range of the resistance change is very large as compared to the MRAM. The basic structure of the real device is very simple, and it is made in such a manner that a lower electrode material, the perovskite-type oxide, and an upper electrode material are deposited in a direction vertical to a substrate. In the meantime, according to the element structure illustrated in the specification of U.S. Pat. No. 6,204,139, the lower electrode material is made of a yttrium barium copper oxide $YBa_2Cu_3O_7$ (YBCO) film deposited on a single crystal substrate of a lantern—aluminum oxide $LaAlO_3$ (LA); the perovskite-type oxide is made of a crystalline praseodymium calcium manganic oxide $Pr_{1-x}Ca_xMnO_3$ (PCMO) film; and the upper electrode material is made of an Ag film deposited by sputtering, respectively. It is informed that the operation of this memory element can change the resistance in the reversible fashion by applying 51 volt of the voltage pulse between the upper and lower electrodes in positive and in negative. It means that a new nonvolatile memory device is available by reading a resistance value in this reversible resistance change operation (hereinafter, referred to as "the switching operation" appropriately).

However, the present inventor variously conducted a study regarding the nonvolatile memory device by using the perovskite-type oxide of which resistance is changed due to the voltage pulse, particularly, the PCMO film, and as a result, there are problems such that the switching operation is not always carried out, for example, the switching operation is not carried out although the resistance is changed due to the voltage pulse and the resistance value is not changed. These problems are major barriers to practical application thereof. In other words, it means that the nonvolatile memory device that can be repeatedly rewritten cannot be realized if the stable switching operation cannot be secured.

SUMMARY OF THE INVENTION

The present invention has been made as one brake through against the foregoing problems into consideration and an object of the present invention is to provide a driving method of a variable resistance element capable of stably continuing the resistance change operation in a reverse fashion to the variable resistance element including a perovskite-type oxide, of which electric resistance is changed by applying a voltage pulse thereto, and a memory device provided with the variable resistance element and capable of stably rewriting the memory data.

The present invention attain the above-described object which comprises a perovskite-type oxide between a first electrode and a second electrode, of which electric resistance between the first electrode and the second electrode is changed by applying a voltage pulse of a predetermined polarity between the first electrode and the second electrode, and having a resistance hysteresis characteristic, in which a changing rate of a resistance value is changed from positive to negative with respect to increase of a cumulative pulse applying time in the application of the voltage pulse; wherein the driving method apply the voltage pulse to the variable resistance element on the basis of the resistance hysteresis characteristic.

Furthermore, in the driving method of the present invention, the voltage pulse is applied to the variable resistance element so that the cumulative pulse applying time is not longer than a specific cumulative pulse applying time, in which the changing rate of the resistance value is changed from positive to negative with respect to increase of the cumulative pulse applying time in the resistance hysteresis characteristic.

In the meantime, according to the present invention, if the voltage pulse is applied to the variable resistance element, the current flows through the variable resistance element for a period of time of applying the voltage pulse as long as the resistance value is not infinitely large, so that this voltage pulse can be grasped as a current pulse. A pulse applying time is also referred to as a pulse width and the pulse width means a period of time that the voltage amplitude in the voltage pulse application in one time is increased in a pulse shape and the cumulative pulse applying time means a sum of respective pulse applying times when applying the voltage pulse of a same polarity in one time or plural times.

According to the above-described each driving method, it is possible to control various resistance values by applying the voltage pulse to the variable resistance element and adjusting the cumulative pulse applying time on the basis of the resistance hysteresis characteristic, in which a changing rate of a resistance value is changed from positive to negative with respect to increase of a cumulative pulse applying time in the application of the voltage pulse.

In addition, as a result of consideration by the inventors of the present invention, it is determined that the cumulative pulse applying time should not be longer than the specific cumulative pulse applying time in the resistance hysteresis characteristic as one condition that the variable resistance element having the perovskite-type oxide can stably perform the switching operation. Accordingly, it is possible to control the resistance value so that the variable resistance element can stably perform the switching operation by applying the voltage pulse so that the cumulative pulse applying time is not longer than the specific cumulative pulse applying time. Thereby, in the case of configuring a nonvolatile memory device provided with the variable resistance element having the perovskite-type oxide as a memory cell, according to the above-described driving method, it is possible to realize a practical nonvolatile memory device capable of performing the stable rewriting operation.

In order to attain the above-described object, the memory device of a variable resistance element according to the present invention may comprise a perovskite-type oxide between a first electrode and a second electrode; a memory cell having a variable resistance element, of which electric resistance between the first electrode and the second electrode is changed by applying a voltage pulse between the first electrode and the second electrode; and a voltage pulse generation circuit for generating the voltage pulse to be applied to the variable resistance element; wherein the variable resistance element has a resistance hysteresis characteristic, in which a changing rate of a resistance value is changed from positive to negative with respect to increase of a cumulative pulse applying time in the application of the voltage pulse; and the voltage pulse generation circuit generates the voltage pulse to be applied to the variable resistance element on the basis of the resistance hysteresis characteristic.

In addition, in the memory device according to the present invention, the voltage pulse generation circuit applies the voltage pulse to the variable resistance element so that the cumulative pulse applying time is not longer than a specific cumulative pulse applying time, in which the changing rate of the resistance value is changed from positive to negative with respect to increase of the cumulative pulse applying time in the resistance hysteresis characteristic.

According to the above-described memory device, if the voltage pulse generation circuit adjusts the cumulative pulse applying time of the voltage pulse to be applied to the variable resistance element on the basis of the resistance hysteresis characteristic, in which a changing rate of a resistance value is changed from positive to negative with respect to increase of a cumulative pulse applying time in the application of the voltage pulse, and this makes it possible to control various resistance values. Thereby, by changing the resistance value of the variable resistance element, the data can be stored in the memory cell, and further, writing into the memory cell and various selections are available as the erasing operation condition.

In addition, it is possible to control the resistance value so that the variable resistance element can stably perform the switching operation by adjusting the cumulative pulse applying time of the voltage pulse so that the cumulative pulse applying time is not longer than the specific cumulative pulse applying time. Thereby, the stable rewriting operation as the memory cell is possible and a practical nonvolatile memory device can be realized.

Further, the driving method of the variable resistance element and the memory device according to the present invention can control the specific cumulative pulse applying time by controlling the voltage amplitude of the voltage pulse.

Moreover, the driving method of the variable resistance element and the memory device according to the present invention can control the resistance value of the variable resistance element after applying the voltage pulse by controlling the pulse applying time or the cumulative pulse applying time of the voltage pulse.

Further, according to the driving method of the variable resistance element and the memory device according to the present invention, the resistance value of the variable resistance element is changed in a reversible fashion with the changing rate of the resistance rate with respect to increase of the cumulative pulse applying time in the resistance hysteresis characteristic in a positive area.

According to the above-described driving method of the variable resistance element and the memory device according to the present invention, the voltage amplitude of the voltage pulse is controlled. Thereby, by controlling the specific cumulative pulse applying time, for example, by making the specific cumulative pulse applying time in the resistance hysteresis characteristic shorter, it is possible to acquire the large resistance change of the variable resistance element by applying the voltage pulse for a short period, and to realized the nonvolatile memory device capable of reading the data at a high speed with a large reading margin.

In addition, by controlling the pulse applying time or the cumulative pulse applying time of the voltage pulse so as to control the resistance value of the variable resistance element after applying the voltage pulse, for example, in a time area that the resistance value is evenly changed with respect to increase of the pulse applying time or the cumulative pulse applying time, the pulse applying time or the cumulative pulse applying time is adjusted. Thereby, the resistance value can be controlled sensitively and the data memory at a multilevel not less than three values is possible. In addition, by setting the pulse applying time or the cumulative pulse applying time at an hour that is equal to the specific cumulative pulse applying time in the resistance hysteresis characteristic or slightly shorter than this, it is possible to acquire large resistance change of the variable resistance, and to realized the nonvolatile memory device having a large reading margin.

In addition, by changing the resistance value of the variable resistance element in a reversible fashion with the changing rate of the resistance rate with respect to increase of the cumulative pulse applying time in the resistance hysteresis characteristic in a positive area, for example, in the case of assuming two memory levels, arbitrary value can be selected as two resistance values at the low resistance side and the high resistance side, and the variable resistance element can be controlled so as to perform the stable switching operation. Thereby, when configuring the nonvolatile memory device provided with the variable resistance element having the perovskite-type oxide as the memory cell, by applying the above-described driving method or using the above-described memory device, and to realized the practical nonvolatile memory device capable of performing the stable rewriting operation.

Further, the memory device according to the present invention may comprise a memory cell array configured by arranging the memory cells in a matrix; wherein the voltage pulse generation circuit is configured so as to be capable of generating a writing voltage pulse of a predetermined polarity and voltage amplitude when writing the data in the memory cell by increasing the resistance value of the variable resistance element; generating an erasing voltage pulse of a predetermined voltage amplitude at a reverse polarity of the writing voltage pulse when erasing the data from the memory cell by decreasing the resistance value of the variable resistance element; and generating a reading voltage pulse smaller than any voltage amplitude at any polarity among the writing voltage pulse and the erasing voltage pulse when reading the memory data of the memory cell by detecting the resistance value of the variable resistance element, separately.

Specifically, according to the above-described memory device, it is possible to selectively apply the writing voltage pulse, the erasing voltage pulse, or the reading voltage pulse to the variable resistance element of the specific memory cell in the memory cell array. Therefore, with respect to arbitrary memory cell, it is possible to write, erase, and read the data, so that the basic memory operation becomes possible. In addition, if the voltage pulse generation circuit controls the cumulative pulse applying time of the writing voltage pulse so as not to be longer than a specific cumulative pulse applying time in the resistance hysteresis characteristic, the stable writing and erasing operations can be repeated in a reverse fashion so as to realize the practical nonvolatile memory device.

Further, in the variable resistance element and the memory device according to the present invention, the variable resistance element has the resistance hysteresis characteristic, in which the changing rate of the resistance value is changed from positive to negative with respect to increase of the cumulative pulse applying time in spite of a polarity of the voltage pulse to be applied between the first electrode and the second electrode.

According to the feature, in spite of a polarity of the voltage pulse to be applied, it is possible to stably carry out the operation for changing the resistance value in a reverse fashion. Accordingly, the practical memory device can be freely designed.

Further, in the variable resistance element and the memory device according to the present invention, the perovskite-type oxide used for the variable resistance element is an oxide including at least one kind of element selected from among Pr, Ca, La, Sr, Gd, Nd, Bi, Ba, Y, Ce, Pb, Sm, and Dy and at least one kind of element selected from among Ta, Ti, Cu, Mn, Cr, Co, Fe, Ni, and Ga. More preferably, the perovskite-type oxide is an oxide of any one group represented by a general formula ($0 \leq x \leq 1$, $0 \leq z \leq 1$), which is selected from among a $Pr_{1-x}Ca_x[Mn_{1-z}M_z]O_3$ group (however, M is any element selected from among Ta, Ti, Cu, Cr, Co, Fe, Ni, and Ga); an $La_{1-x}AE_xMnO_3$ group (however, AE is any divalent alkaline-earth metal selected from among Ca, Sr, Pb, and Ba); an $RE_{1-x}Sr_xMnO_3$ group (however, RE is any trivalent rare-earth metal selected from among Sm, La, Pr, Nd, Gd, and Dy); $La_{1-x}Co_x[Mn_{1-z}Co_z]O_3$ group; a $Gd_{1-x}Ca_xMnO_3$ group; and an $Nd_{1-x}Gd_xMnO_3$ group.

According to the above-described feature, it is possible to largely change the resistance of a variable resistance element, and in the case of configuring the memory cell including this variable resistance element, the reading margin of the memory cell is made large so as to be capable of performing the stable memory operation.

In addition, in the variable resistance element and the memory device according to the present invention, it is preferable that the second electrode includes at least one kind of a single piece of noble metal of platinum group metal, an alloy based on the noble metal, an oxide conductive substance of any element selected from among Ir, Ru, Re, and Os; and an oxide conductive substance selected from among SRO ($SrRuO_3$), LSCO (($LaSr$)$CoO_3$), YBCO ($YbBa_2Cu_3O_7$). Further, it is preferable that the first electrode includes at least one kind of an a noble metal of platinum group metal, a single piece of metal or its alloy selected from among Ag, Al, Cu, Ni, Ti, and Ta, an oxide conductive substance of any element selected from among Ir, Ru, Re, and Os; and an oxide conductive substance selected from among SRO ($SrRuO_3$), LSCO (($LaSr$)$CoO_3$), YBCO ($YbBa_2Cu_3O_7$).

DETAILED DESCRIPTION OF THE INVENTION

The embodiments of the driving method of the variable resistance element and the memory device (hereinafter, referred to as "the present method" and "the present unit", respectively) according to the present invention will be described below with reference to the drawings.

Figure 1:
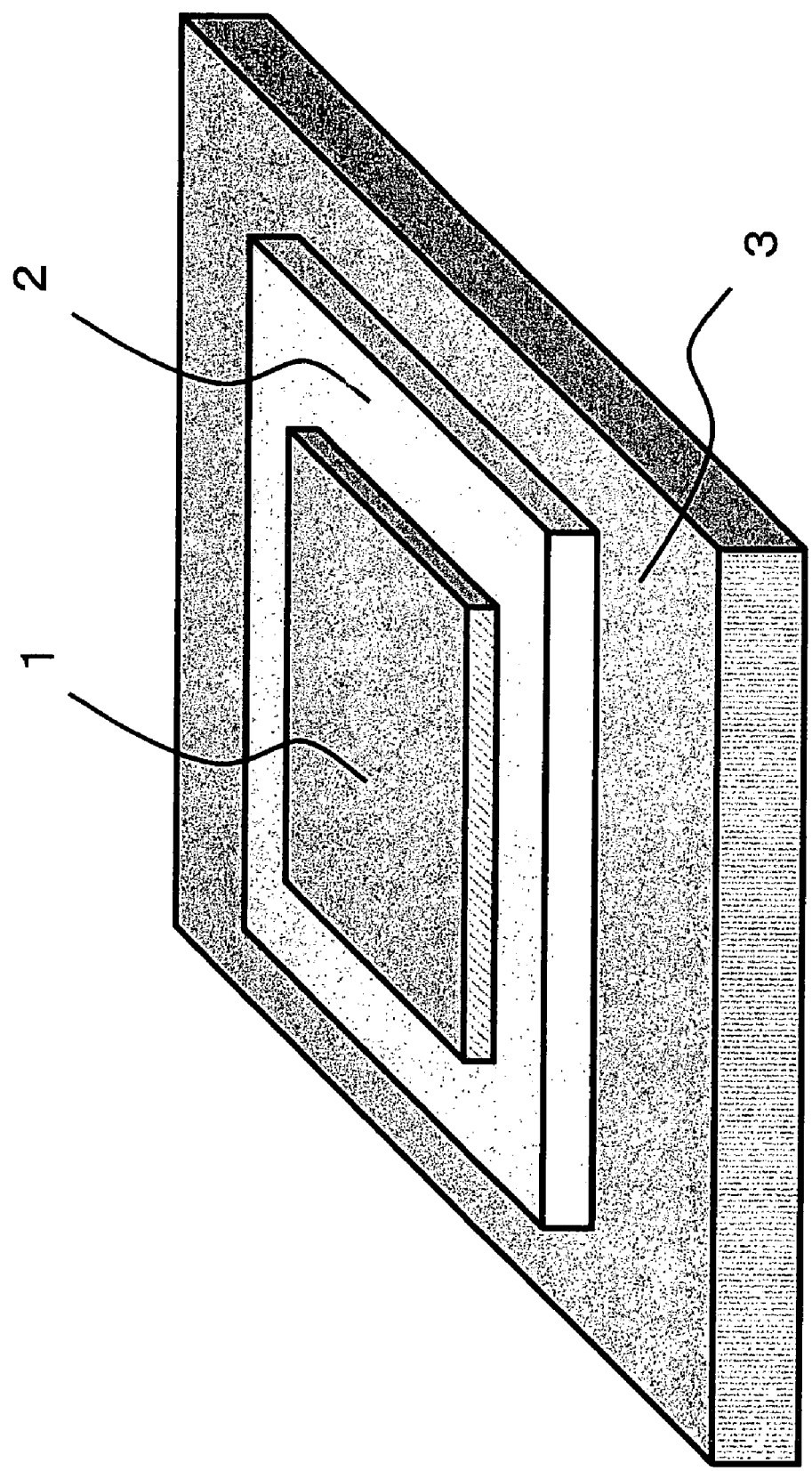
FIG. 1 is a perspective view showing a basic structure of a variable resistance element that is used for a driving method of the variable resistance element and a memory device according to the present invention.

FIG. 1 is a perspective view showing a basic structure of the variable resistance element that is used for the driving method of the variable resistance element and the memory device according to the present invention. As the basic element structure, the variable resistance element has a lamination structure in which a lower electrode 3 as a second electrode, a variable resistance body 2 of a perovskite-type crystal structure, and an upper electrode 1 as a first electrode are deposited in order.

The perovskite-type oxide as the variable resistance body 2 is represented by "$ABO_3$" in a chemical formula and a lead titanate ($PbTiO_3$) and a barium titanate ($BaTiO_3$) or the like are representative examples. For example, Pr, and Mn group perovskite-type oxides are also represented by the chemical formula of "$ABO_3$" and at a position of "A", Pr is partially or entirely replaced and at a position of "B", Mn is partially or entirely replaced. For example, a simple formation of $Pr_xAl_{1-x}MnO_3$ group ($0 \leq x \leq 1$) may be available. In addition, a formation that the number of atomic elements replaced with A or B is increased such as $(Pr_xAl_{1-x})(Mn_yB_{1-y})O_3$ group ($0 \leq x \leq 1$, $0 \leq y \leq 1$) or the like may be considered. As "A", at least one kind of elements selected from among Ca, La, Sr, Gd, Nd, Bi, and Ce can be used, and as "B", at least one kind of elements selected from among Ta, Ti, Cu, Cr, Co, Fe, Ni, and Ga can be used.

As the oxide of the perovskite-type structure of the variable resistance body 2, typically, $(Pr, Ca) MnO_3$, $SrTiO_3$, $(Ba, Sr) TiO_3$, $LaMnO_3$, $LaTiO_3$, $(Nd, Sr) MnO_3$, and $(La, Sr) MnO_3$ or the like may be considered.

In this kind of materials, the electric resistance is changed when the voltage pulse is applied and among them, in the material of $Pr_{1-x}Ca_x MnO_3$ group (a PCMO film), the resistance value is more largely changed by the voltage pulse, and further, the composition near x=0.3 is preferable for the variable resistance body 2 of the present invention.

In addition, as the lower electrode 3, a simple structure of a platinum group metal represented by Pt, Ir, Ph, and Pd having high lattice matching with perovskite-type oxide, a high electrical conductivity and a high oxidation resistance or an alloy based on the noble metal, or an oxide conductive material such as Ir, Ru, Re, Os, or the oxide conductive material such as SRO ($SrRuO_3$), LSCO (($LaSr) CoO_3$) and YBCO ($YbBa_2Cu_3O_7$) or the like may be preferably used.

On the other hand, the upper electrode 1 is not always exposed under a high temperature oxygen atmosphere, so that the upper electrode 1 is not limited to the noble metal element such as these Pt, Ir, and Ru, and various materials, for example, a metal such as Ag, Al, Cu, Ni, Ti, and Ta, and the oxide conductive material or the like may be applicable.

According to the present embodiment, a method of forming the variable resistance element of the basic structure shown in FIG. 1 is as follows:

On a ground substrate (not illustrated), a Pt film is formed by the sputtering method as the lower electrode 3. According to the present embodiment, the sputtering method is used, however, various methods such as a vacuum deposition method may be appropriately used. However, in view of an orientation control and a stress control, the sputtering method capable of setting a growth parameter in a wide range is preferable.

In the meantime, in order to improve adhesiveness or prevent reaction, a contact layer or a barrier layer may be appropriately inserted between the lower electrode 3 and the ground substrate. For example, in the case of forming the lower electrode 3 on a BPSG film or a silicon oxide film, it is effective to insert Ti, TiO, and $Al_xO_y$ or the like. In addition, in the case of securing the electric connection between the substrate and the lower electrode using a silicon substrate, remarkable alloying is generated between Pt and Si or between Pt and a tungsten plug and an oxidation reaction is generated at a boundary face, so that it is effective to insert Ti, TiN, $Ti_{1-x}Al_xN$, TaN, TiSiN, and TaSiN or the like between the lower electrode 3 and the Si substrate or between the lower electrode and the tungsten plug.

In the next place, according to the sputtering method, a PCMO film as the variable resistance body 2 is formed on the lower electrode 3 at a deposition temperature of 500° C. In this case, the size of the PCMO film is designed to be smaller than the size of the electrode face of the lower electrode but to be larger than the size of the upper electrode 1, and a thickness of the PCMO film is made 100 nm.

Further, according to the sputtering method, the Pt film is formed on the variable resistance body 2 as the upper electrode 1 so as to be smaller than the size of the variable resistance body 2. As described above, the variable resistance element is formed as the basic structure. According to the present embodiment, the upper electrode 1, the variable resistance body 2, and the lower electrode 3 are designed so that their sizes are changed in series. It is preferable that the sizes of the upper and lower electrodes 1, 3 are different and the variable resistance body 2 is made larger than the smaller electrode.

Figure 2:
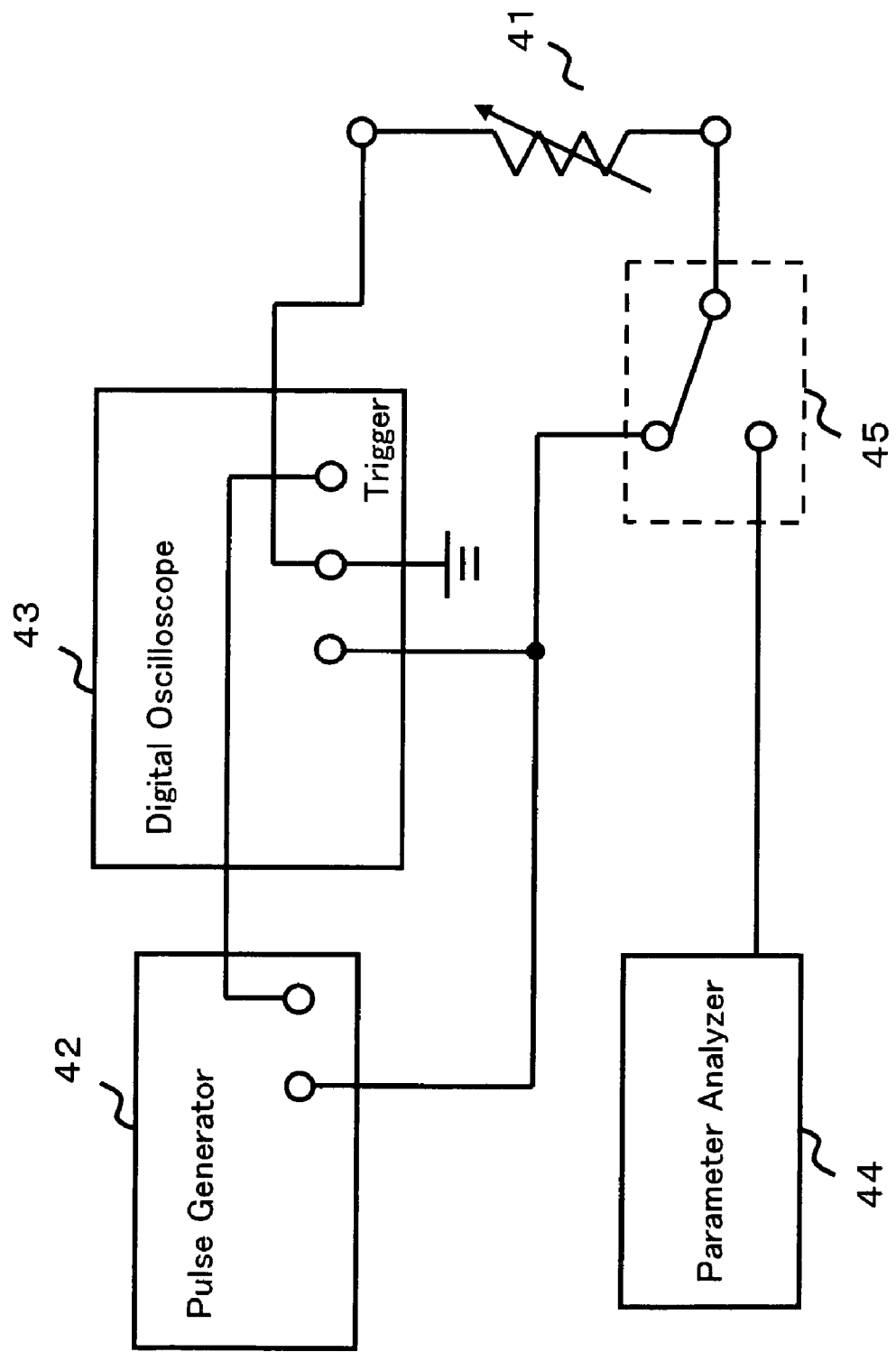
FIG. 2 illustrates a structure of a measurement system for measuring a resistance value against application of a voltage pulse to the variable resistance element and an I-V characteristic.

In the next place, a relation between the cumulative pulse applying time of the voltage pulses applied to the variable resistance element and the resistance value of this variable resistance element shown in FIG. 1 will be described below. At first, FIG. 2 illustrates a structure of a measurement system for measuring a resistance value against application of a voltage pulse to the variable resistance element 41 manufactured as described above and a I-V characteristic. This measurement system is configured to include a pulse generator 42, a digital oscilloscope 43, a parameter analyzer 44, and a switch 45. As for the parameter analyzer 44, for example, a model number 4156B manufactured by Agilent Technology Inc. is used as a current and voltage measuring machine. The pulse generator 42, the digital oscilloscope 43, and the parameter analyzer 44 are connected to the variable resistance element 41 via the switch 45. Upon application of the voltage pulse, operating the switch 45, the pulse generator 42 is electrically connected to the variable resistance element 41 to apply the voltage pulse. The voltage pulse to be generated in this time is monitored by the digital oscilloscope 43. Subsequently, connecting the switch 45 to the parameter analyzer 44 (separated from the pulse generator 42), the I-V characteristic of the variable resistance element 41 is measured.

As the voltage pulse from the pulse generator 42, the applying voltage −4V (the negative polarity pulse of the voltage amplitude 4V) is applied to the upper electrode of the variable resistance element 41 at a pulse width (a pulse applying time) 10 n seconds, and the resistance value after application is acquired by measuring the I-V characteristic with the parameter analyzer 44. After measuring, the voltage pulse is applied from the pulse generator 42 to the variable resistance element 41 once again at the applying voltage −4V and the pulse width 10 n seconds, and the resistance value after application is acquired by measuring the I-V characteristic with the parameter analyzer 44. In the next place, in order to make the measuring hour shorter, the pulse width of the voltage pulse is only changed into 30 n seconds at the applying voltage −4V, the voltage pulse is applied in the same way, and measurement of the I-V characteristic is repeated at several times. In the same way, the pulse width of the voltage pulse is applied while extending it in series, for example, into 100 n seconds, 300 n second, 1μ seconds, 3μ seconds, 10μ seconds, 30μ seconds, and 100μ seconds to measure the I-V characteristic.

Measurement of the I-V characteristic has been performed for each application of the voltage pulse, and applying the voltage by steps of 0.1 V from −1 V to +1 V to measure the current value of each step. In the variable resistance element used in the present embodiment, its value is changed by applying the voltage pulse of −4V, however, the value is scarcely changed by applying the relatively low voltage from −1V to +1V. This makes it possible to measure the resistance value of the variable resistance element after applying the voltage pulse without having effects on application of the voltage pulse hereinafter.

In the meantime, in the measurement of the resistance value, even if the application of the voltage pulse has been carried out intermittently in plural times to measure the resistance value for each application of the voltage pulse, since the voltage to be applied to the variable resistance element upon measurement of the resistance value does not have effects on the variable resistance element substantially, respective voltage pulses applied for measuring a rate of the resistance value change are cumulatively added in series for the variable resistance element. Accordingly, as described above, in place of the application of the voltage pulse with a short pulse width, even if a single voltage pulse having the pulse width that is a sum of these pulse widths is added, the variable resistance element represents the corresponding resistance value in accordance with a resistance hysteresis characteristic (to be described later).

Figure 3:
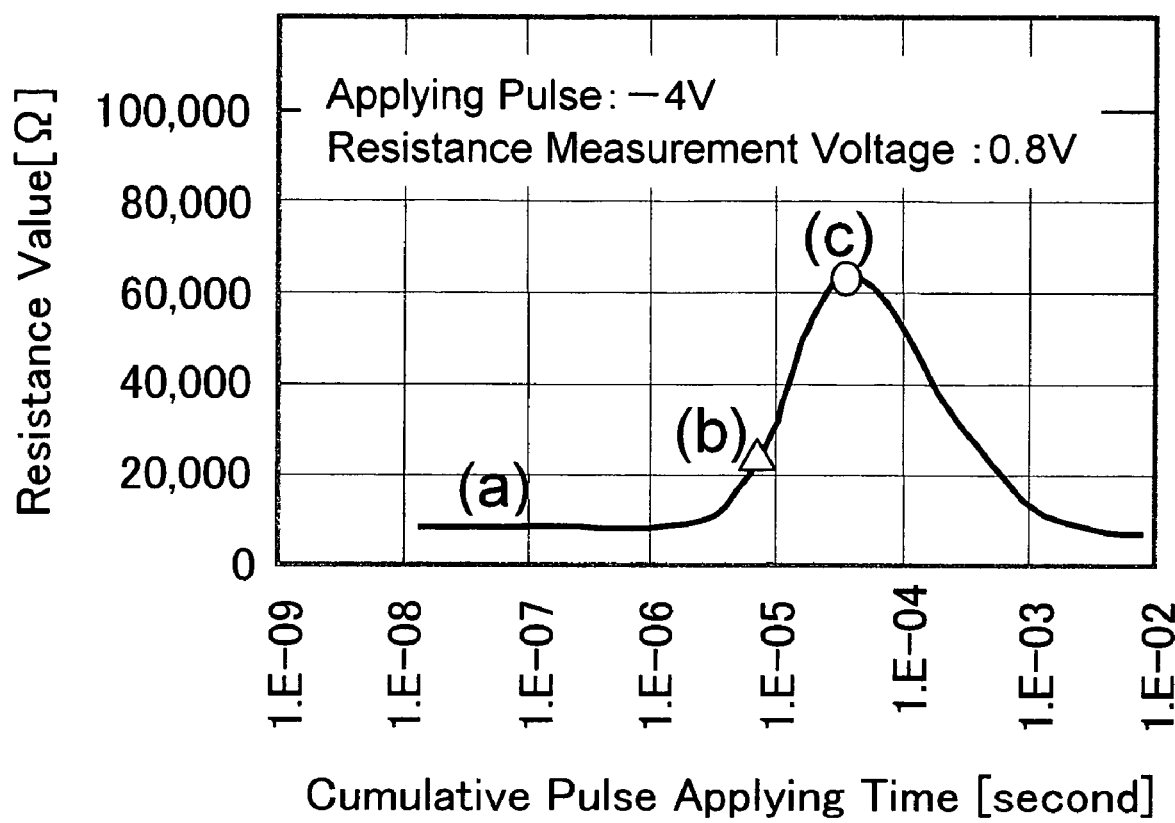
FIG. 3 is a resistance hysteresis characteristic diagram showing a relation between the resistance value of the variable resistance element and cumulative pulse applying time of the applying voltage pulses.

FIG. 3 shows the plotted resistance value of the variable resistance element corresponding to the cumulative value of the pulse applying time of the applying voltage pulses (namely, the cumulative pulse applying time). A horizontal axis of FIG. 3 represents the cumulative pulse applying time of the applying voltage pulses in a logarithm and a vertical axis represents the resistance value. The resistance value of the vertical axis is introduced by converting a representative current value when +0.8 V is applied from among the value measuring the I-V characteristic in a range of the voltage from −1 V to +1V at each point into the resistance value. Hereinafter, the voltage used for this conversion of the resistance value is represented as "a resistance value measurement voltage". In the meantime, according to the present embodiment, on the basis of the lower electrode, the case that a positive voltage is applied to the upper electrode as the voltage pulse is defined as a voltage pulse of the positive polarity and the case that a negative voltage is applied to the upper electrode as the voltage pulse is defined as a voltage pulse of the negative polarity. Accordingly, according to the voltage pulse of the positive polarity, three patterns, namely, the case that 0V is applied to the lower electrode and the positive voltage is applied to the upper electrode; the case that 0V is applied to the upper electrode and the negative voltage is applied to the lower electrode; and the case that the negative voltage is applied to the lower electrode and the positive voltage is applied to the upper electrode may be considerable. In addition, in the case of the voltage pulse of the negative polarity, three voltage application patterns may be also considerable.

Thus, as a result of measurement of the resistance values accumulating the applying time of the voltage pulses, as shown in FIG. 3, the variable resistance element substantially maintains the state of the resistance value of the state that the variable resistance element is manufactured at the beginning of the voltage pulse application in relation between the cumulative pulse applying time and the resistance value (hereinafter, the state that this resistance value is scarcely changed even if the voltage pulse is applied and the low resistance state is maintained is referred to as "an initial state"). Subsequently, it has been found that there is a period of time having a positive resistance value changing rate (namely, an area that the resistance value is increased in accordance to increase of the cumulative pulse applying time), then, the resistance value passes through the maximum point where the resistance value changing rate is changed from positive to negative (shown in FIG. 3C), and after the cumulative pulse applying time passes through the maximum point, the resistance value is decreased in accordance with application of the voltage pulse vice versa. Hereinafter, the cumulative pulse applying time at the maximum point is referred to as "a specific cumulative pulse applying time". In the case of the variable resistance element used in the present embodiment, when the cumulative pulse applying time is not more than $5 \times 10^{-7}$ seconds, the resistance value is maintained to be about $1.0 \times 10^4 \Omega$, and during a period of time from $1 \times 10^6$ seconds to $7 \times 10^{-5}$ seconds, the resistance value is increased to about $7.0 \times 10^4 \Omega$. Then, if the cumulative pulse applying time is not less than $7 \times 10^{-5}$ seconds, the resistance value begins to lower, and at $1 \times 10^{-2}$ seconds, the resistance value is decreased to about $1.0 \times 10^4 \Omega$.

In a form having the maximum point where the resistance value changing rate is changed from positive to negative made by the variable resistance element (for example, a form having a peak like a mountain), depending on a manufacturing method of the variable resistance element and a configuration of the element, a material configuring the element, a method of forming the element, and the voltage pulse to be applied or the like, the position of the maximum point (the specific cumulative pulse applying time) and the resistance value at the maximum point are varied, however, in the variable resistance element made of the perovskite-type oxide, of which resistance value can be changed by application of the voltage pulse, it is found that a form such that the resistance value changing rate is changed from positive to negative, namely, a form having a peak like a mountain is made. In the meantime, the inventors of the present invention call this characteristic curve line as "a resistance hysteresis curve line" and call this characteristic as "a resistance hysteresis characteristic".

In addition, as described above, FIG. 3 illustrates the change of the resistance value when the voltage pulses of the relatively short width are accumulated, however, it is confirmed that, in the case of measuring the resistance value changing rate not by the method of accumulating the voltage pulses but by the method of applying the voltage pulse as the single voltage pulse having the pulse width corresponding to the cumulative pulse applying time, the resistance value changing rate indicates the substantially same resistance hysteresis characteristic.

Figure 4:
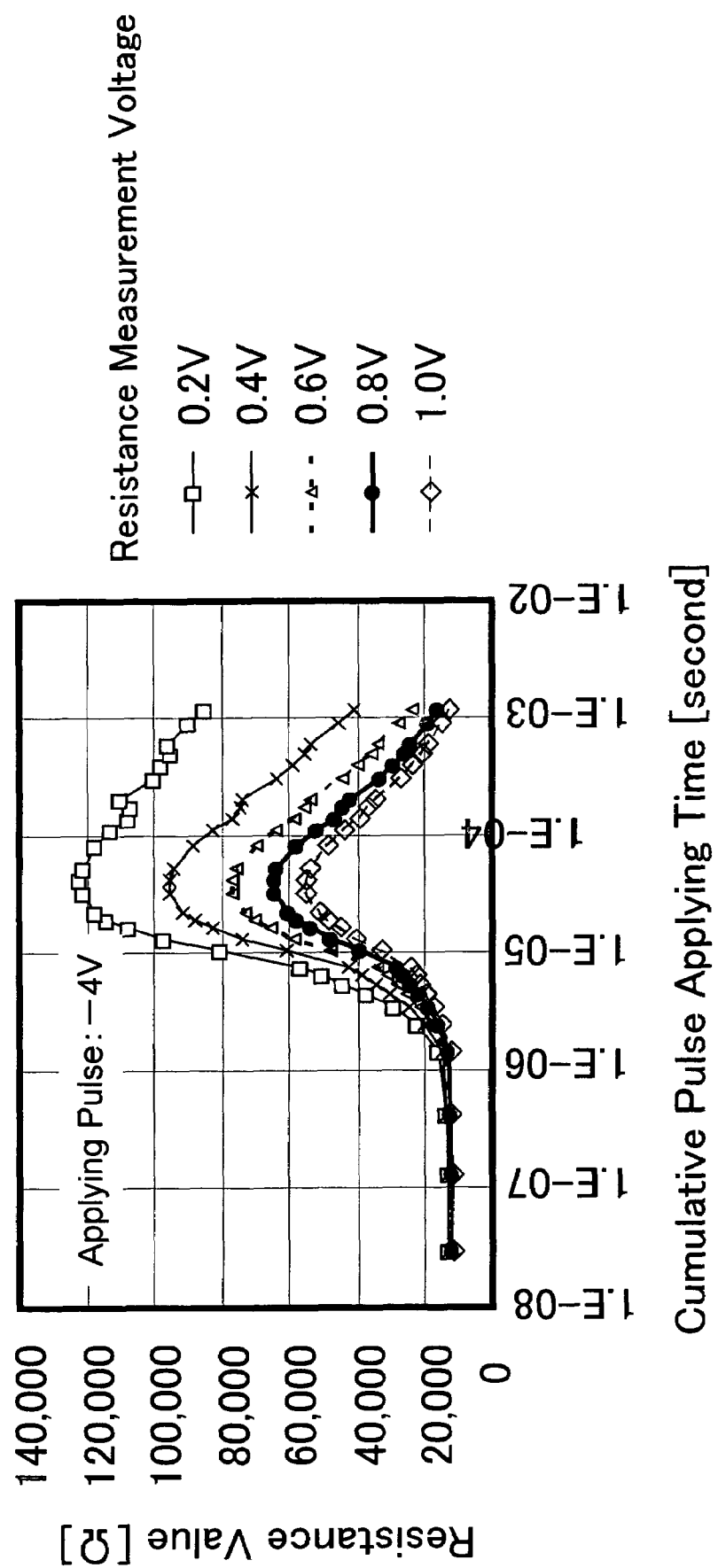
FIG. 4 is a resistance hysteresis characteristic diagram showing a relation between the resistance value of the variable resistance element and cumulative pulse applying time of the applying voltage pulses with a resistance measurement voltage defined as a parameter.

FIG. 4 shows a resistance hysteresis curve line with a voltage value (a resistance measurement voltage) when converting the resistance value from the I-V characteristic defined as a parameter. The indication of the horizontal and vertical axes is identical with FIG. 3. The resistance value of the vertical axis is the resistance value calculated from the I-V characteristic at respective resistance measurement voltages, and respective resistance hysteresis curve lines are made by plotting the resistance values at resistance measurement voltages of 0.2V, 0.4V, 0.6V, 0.8V, and 1.0V, respectively. It is confirmed that, depending on the difference of the resistance measurement voltage, the resistance value changing rate is also changed, and particularly, the resistance change from the initial state to the maximum point is decreased as the resistance measurement voltage is higher.

Figure 5:
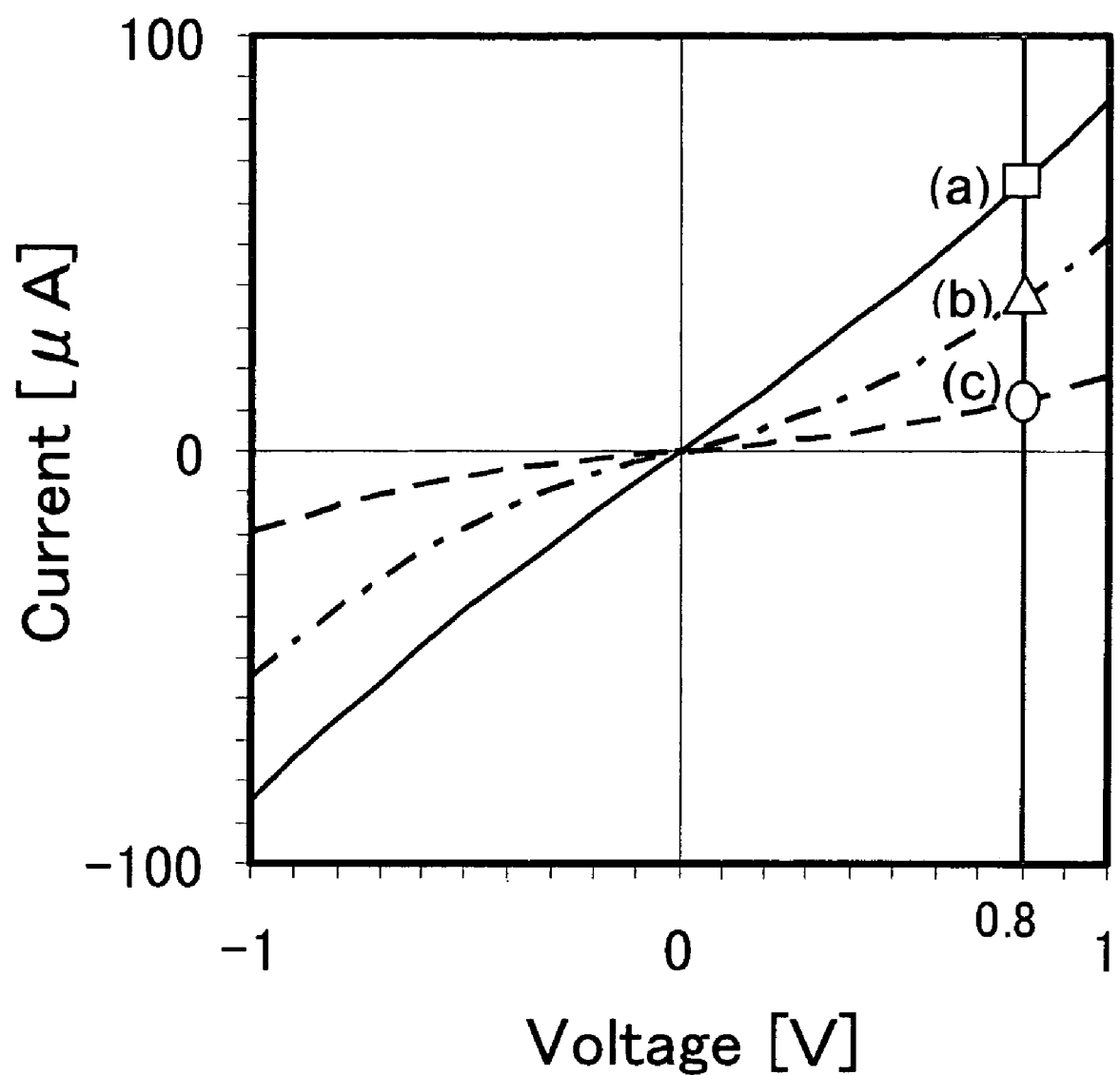
FIG. 5 is an I-V characteristic diagram showing the I-V characteristic at three different cumulative pulse applying time.

FIG. 5 shows the I-V characteristic at three different cumulative pulse applying time of the variable resistance element. In FIG. 5, a vertical axis indicates a current value and a horizontal axis indicates a voltage from −1V to +1V. FIG. 5 shows respective I-V characteristic of each case of the initial state (a) that the resistance value is scarcely changed when the cumulative pulse applying time is $2 \times 10^{-7}$ seconds; (b) that the resistance value is in the process of changing at the positive resistance value changing rate at the cumulative pulse applying time of $8 \times 10^{-6}$ seconds; and (c) that the positive resistance value changing rate reaches to substantially 0 at the specific cumulative pulse applying time of $4 \times 10^{-5}$ seconds in the resistance hysteresis curve line of FIG. 3. In other words, it has been obvious that the variable resistance element indicates the I-V characteristic peculiar to each cumulative pulse applying time of the resistance hysteresis curve line shown in FIG. 3. In the case of (a), namely, the initial state area of a low resistance, it forms a substantially linear I-V characteristic, however, in the case of (b), namely, the middle of the mountain of the resistance hysteresis curve line, as compared to the case of (a), the inclination of the I-V characteristic is made smaller, and a no-linear characteristic is represented. Further, in the case of (c), namely, the maximum point of the resistance hysteresis curve line, as compared to the case of (b), the inclination of the I-V characteristic is made smaller, and a no-linear characteristic is represented more intensely.

The inventors of the present invention attain to a new finding in the process of further consideration of the above-described resistance hysteresis characteristic and this will be described below.

Figure 6A:
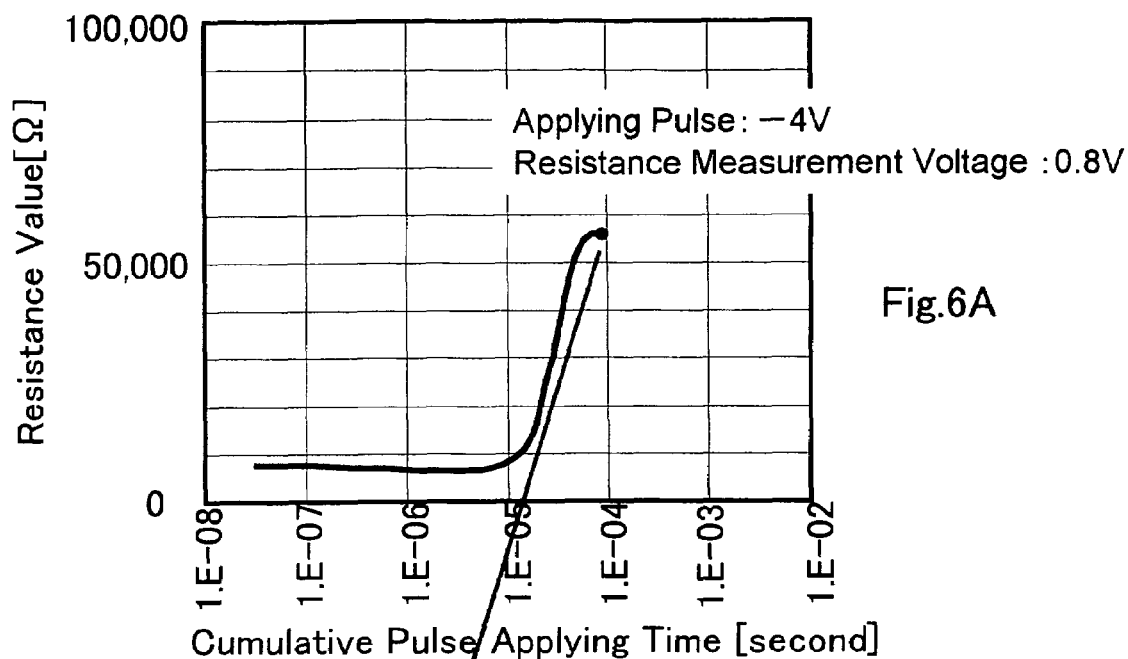
FIGS. 6A and 6B are two resistance hysteresis characteristic diagrams for explaining a reversibility of the resistance hysteresis characteristic of the variable resistance element.
Figure 6B:
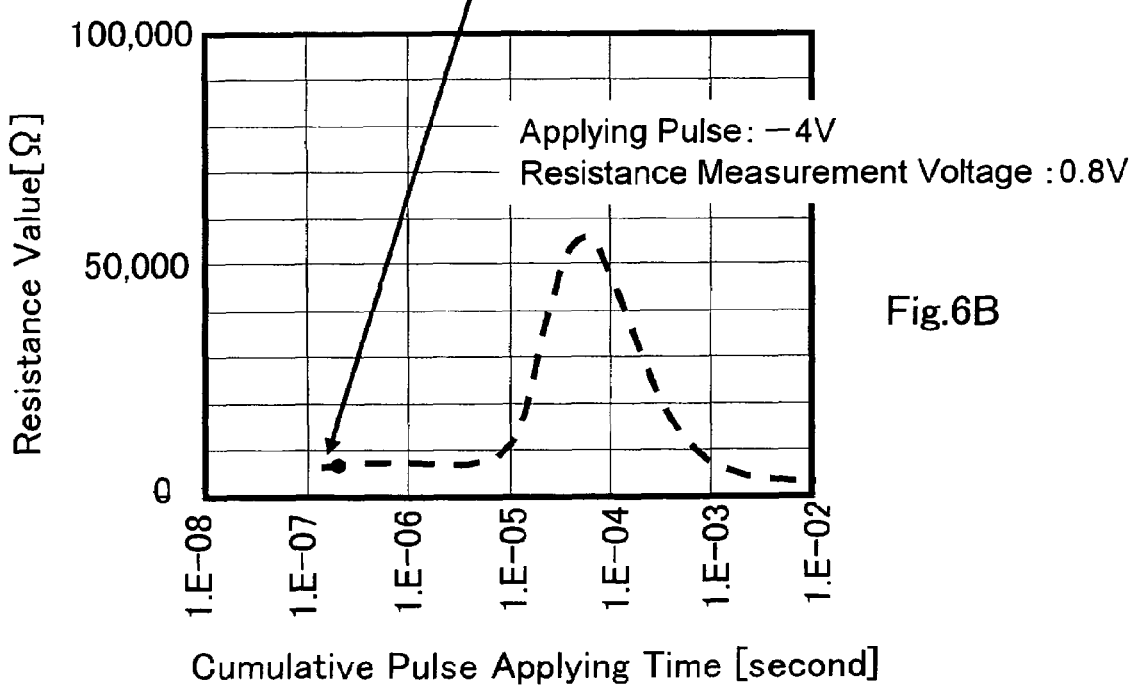
Figure 7A:
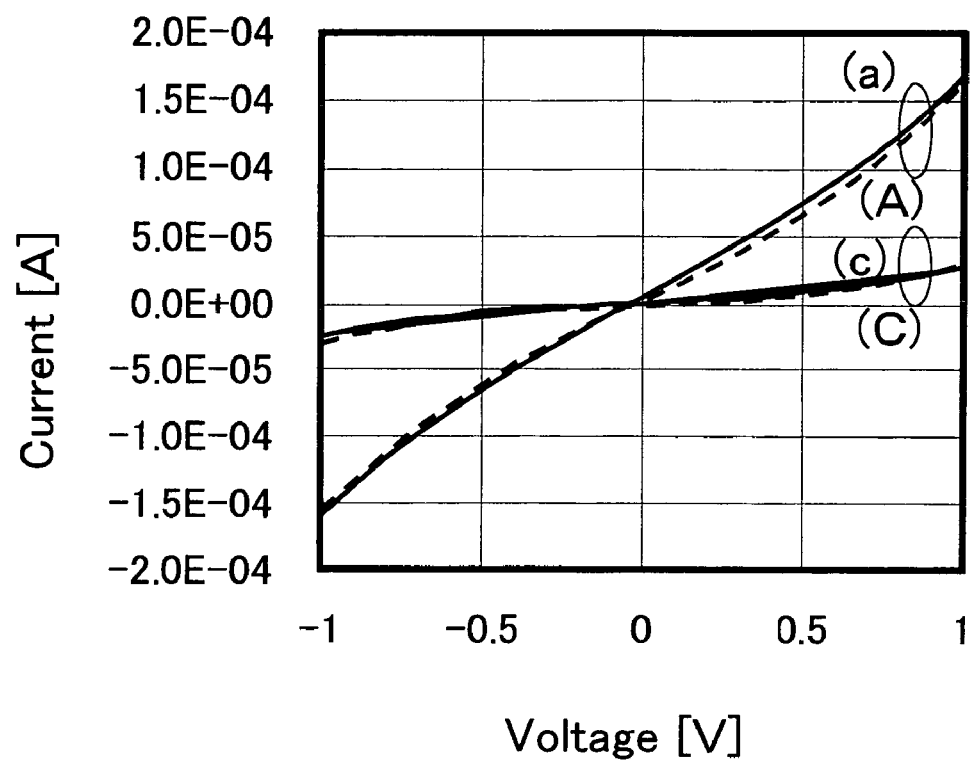
FIG. 7A is the I-V characteristic diagram showing each I-V characteristic at a low resistance state and a high resistance state of the variable resistance elements of the two resistance hysteresis characteristic curve lines shown in FIG. 6.

FIG. 6 is a view explaining a reversibility of the resistance hysteresis characteristic, and FIG. 7A is the I-V characteristic diagram measuring each I-V characteristic at a low resistance state and a high resistance state of the variable resistance elements of the two resistance hysteresis curve lines in FIG. 6.

As same as the measurement of the resistance hysteresis characteristic shown in FIG. 3, till the maximum point where the resistance changing rate is changed from positive to negative is found while repeatedly applying the negative voltage pulse of −4V to the upper electrode, the resistance hysteresis curve line is introduced. This result is shown in FIG. 6A. In the variable resistance element used for the present measurement, the resistance value is scarcely changed till the cumulative pulse applying time $1 \times 10^{-5}$ seconds and it is maintained to be about $8 \times 10^3 \Omega$ of the initial state; the resistance value begins to rise from the cumulative pulse applying time $1 \times 10^{-5}$ seconds; and it is increased to the maximum resistance value $5.7 \times 10^4 \Omega$ at the cumulative pulse applying time $7 \times 10^{-5}$ seconds to be the high resistance state. In the meantime, the resistance measurement voltage converting the each resistance value from the I-V characteristic is 0.8 V.

In the next place, in order to return the resistance value from the high resistance state into the initial state, namely, the low resistance state, the voltage pulse of the inverse polarity is applied in plural times at a pulse applying time shorter than the specific cumulative pulse applying time of the resistance hysteresis characteristic so that the resistance value is substantially returned to the value of the initial state. Specifically, by applying the voltage pulse of the positive polarity of +4V and several μ seconds to the upper electrode in two or three times, the resistance value is substantially returned to the value of the initial state, namely, about $8 \times 10^3 \Omega$.

Moreover, from the point where the resistance value is substantially returned to that of the initial state, as same as the above, repeatedly applying the voltage pulse −4V of the negative polarity, the resistance hysteresis curve line is introduced. This result is shown in FIG. 6B. As shown in FIG. 6B, the resistance value is scarcely changed till the vicinity of the cumulative pulse applying time $1 \times 10^{-5}$ seconds and it is maintained to be $8 \times 10^3 \Omega$ of the initial state; the resistance value begins to rise from the vicinity of the cumulative pulse applying time $1 \times 10^{-5}$ seconds; and it is increased to the maximum resistance value $5.7 \times 10^4 \Omega$ at the cumulative pulse applying time $7 \times 10^{-5}$ seconds. Then, the resistance value is gradually decreased to about $4.0 \times 10^3 \Omega$ at the cumulative pulse applying time $2 \times 10^{-3}$ seconds. In the meantime, the resistance measurement voltage converting the each resistance value from the I-V characteristic is 0.8 V.

As shown in FIG. 6, in the resistance hysteresis curve line introduced by applying the negative polarity voltage pulse of the first time in series till it attains to the maximum point (FIG. 6A) and in the resistance hysteresis curve line introduced by applying the negative polarity voltage pulse of the second time returning the resistance value to that of the initial state once after attaining to the high resistance state in the vicinity of the maxim point (FIG. 6A), the substantially equal resistance hysteresis curve lines are acquired.

Figure 7B:
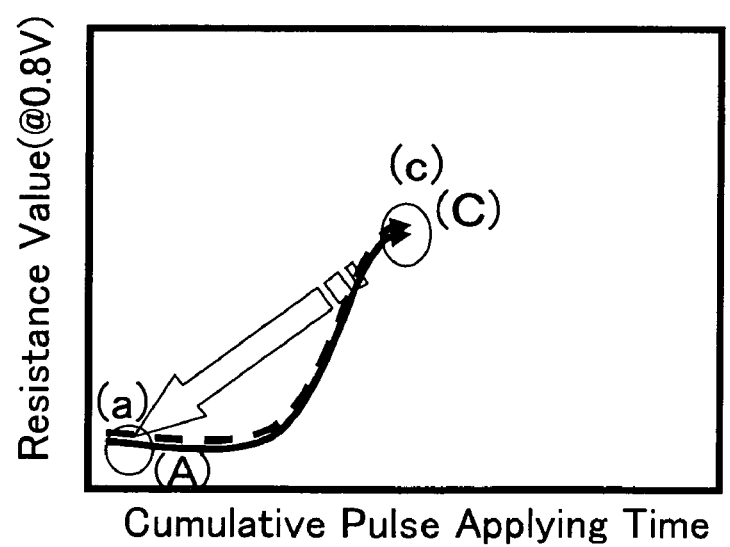
FIG. 7B is a resistance hysteresis characteristic diagram combining the two resistance hysteresis characteristic curve lines in FIG. 6.

In addition, FIG. 7A shows four I-V characteristic in total of two cumulative pulse applying times at a low resistance state and a high resistance state of the variable resistance elements of the two resistance hysteresis characteristic curve lines shown in FIGS. 6A and 6B. The I-V characteristic at the initial state before applying the voltage pulse at the first time is represented by a curve line a. Applying the negative polarity voltage pulse of −4V at the first time, the I-V characteristic at the specific cumulative pulse applying time when the resistance hysteresis curve line reaches the maximum point is represented by a curve line c. In addition, the I-V characteristic when the resistance value is substantially returned to that of the initial state applying the positive polarity voltage pulse of +4V is represented by a curve line A, and the I-V characteristic at the specific cumulative pulse applying time when the resistance hysteresis curve line reaches the maximum point applying the negative polarity voltage pulse at the second time of −4 V once again is represented by a curve line C. FIG. 7B shows a measurement point on the resistance hysteresis curve line in this case. Four I-V characteristics shown in FIG. 7A are identical to the I-V characteristic at four measurement points shown in FIG. 7B. As shown in FIG. 7A, the curve line a and the curve line A are shaped in substantially the same forms, so that it is obvious that the curve line c and the curve line C are also shaped in substantially the same forms. In other words, it has been found that, when the resistance value is changed by applying the negative polarity voltage pulse to be the high resistance state and when the resistance value is returned to the low resistance state by applying the positive polarity voltage pulse and then, the negative polarity voltage pulse is applied once again, if the cumulative pulse applying time for changing the resistance value into the high resistance state reaches the specific cumulative pulse applying time, the I-V characteristic of the variable resistance element at each resistance state is maintained to be the initial characteristic even if the switching operation between the low resistance state and the high resistance state is repeated.

Figure 8A:
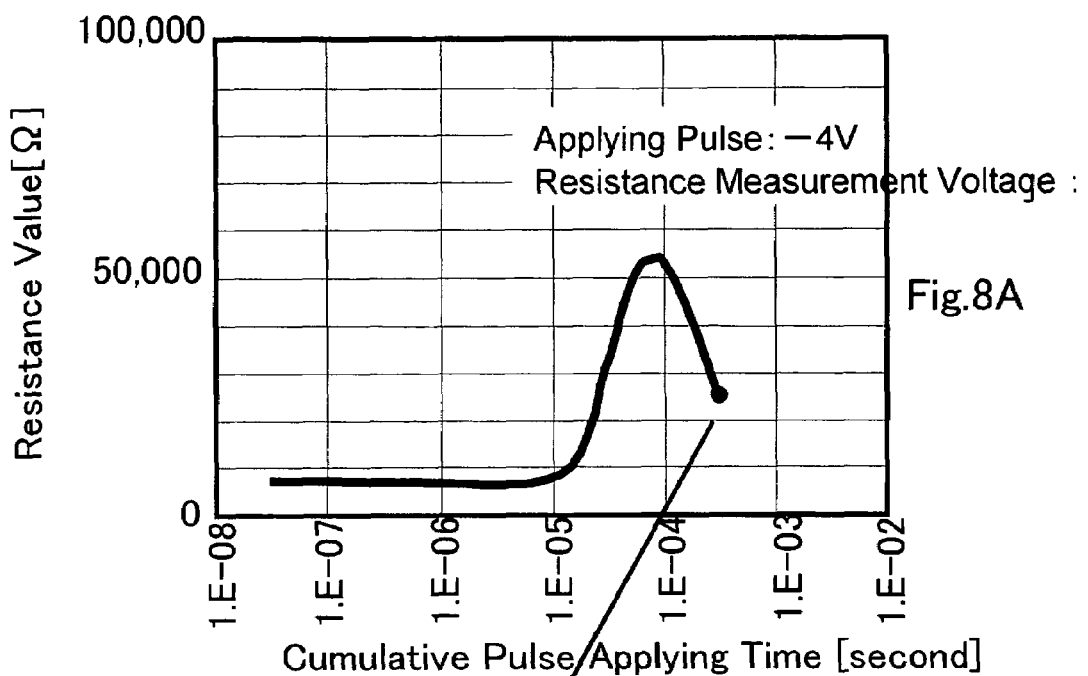
FIGS. 8A and 8B are two resistance hysteresis characteristic diagrams for explaining a no reversibility of the resistance hysteresis characteristic of the variable resistance element.
Figure 8B:
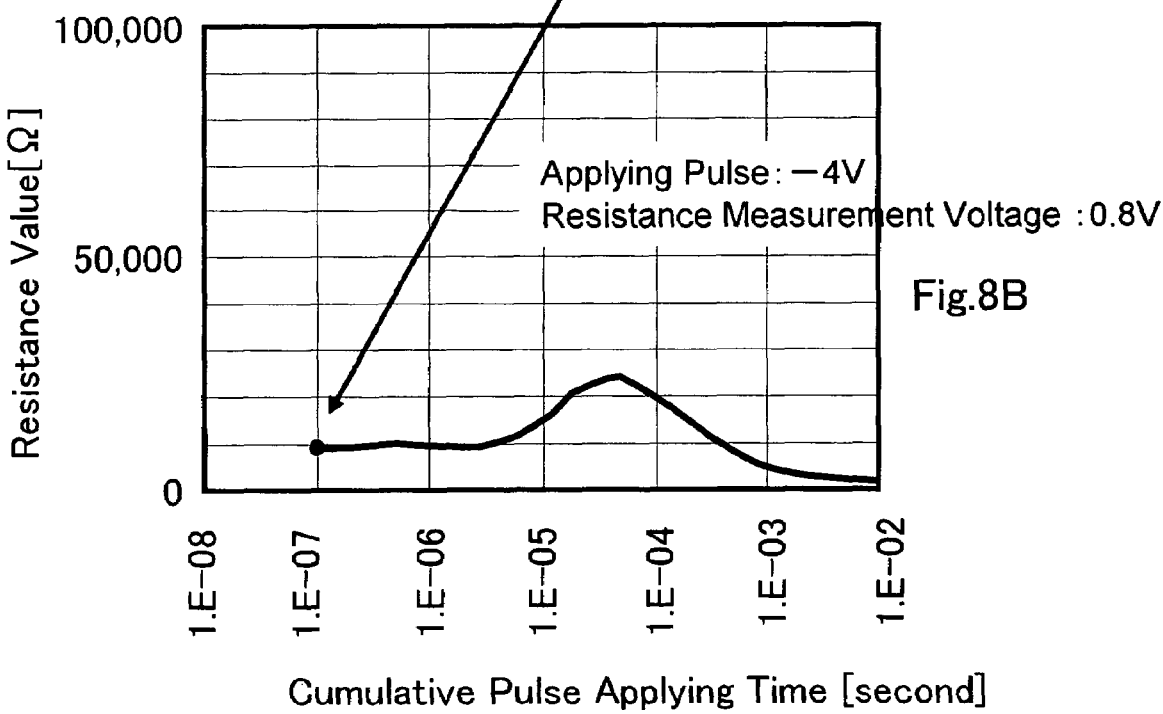
Figure 9A:
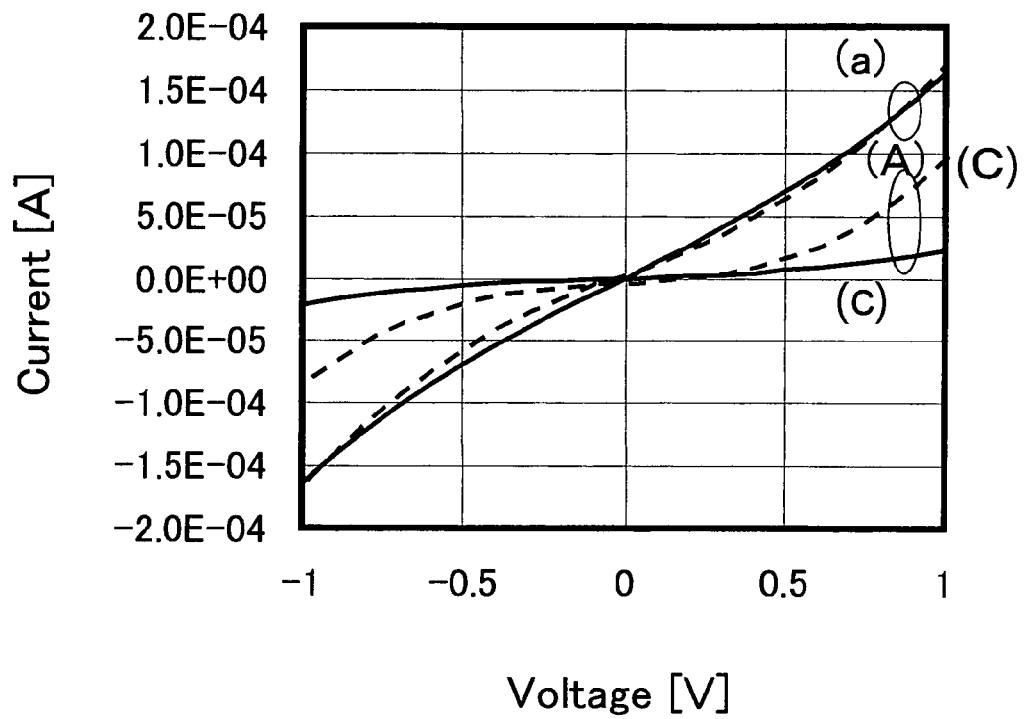
FIG. 9A is the I-V characteristic diagram showing each I-V characteristic at a low resistance state and a high resistance state of the variable resistance elements of the two resistance hysteresis characteristic curve lines in FIG. 8.

FIG. 8 illustrates the no reversibility of the resistance hysteresis curve line. In addition, FIG. 9A is a diagram measuring respective I-V characteristic at the low resistance state and the high resistance state in two resistance hysteresis curve lines in FIG. 8.

As same as the introduction of the resistance hysteresis curve line shown in FIG. 6, repeatedly applying the negative polarity voltage pulse of −4V, the resistance hysteresis curve line has been introduced till the resistance value is lowered beyond the maximum point of the resistance hysteresis curve line. This result is shown in FIG. 8A. According to the variable resistance element used in this measurement, the resistance value is scarcely changed till the cumulative pulse applying time $1\times10^{-5}$ seconds and it is maintained to be $8\times10^3\Omega$; the resistance value begins to rise from the cumulative pulse applying time $1\times10^{-5}$ seconds; and it is increased to the maximum resistance value $5.7\times10^4\Omega$ at the cumulative pulse applying time $7\times10^{-5}$ seconds. Then, the resistance value is decreased by making the cumulative pulse applying time longer and further, measurement has been continued till the cumulative pulse applying time becomes $3\times10^{-4}$ seconds. When the cumulative pulse applying time becomes $3\times10^{-4}$ seconds, the resistance value is lowered to about $2.5\times10^4\Omega$. In the next place, as same as the above-described case, the voltage pulse of the inverse polarity is applied in plural times at a pulse applying time shorter than the specific cumulative pulse applying time of the resistance hysteresis curve line so that the resistance value is substantially returned to the value of the initial state. Specifically, by applying the voltage pulse of the positive polarity of +4V and several μ seconds to the upper electrode in two or three times, the resistance value is substantially returned to the value of the initial state, namely, about $8\times10^3\Omega$.

Moreover, from the point where the resistance value is substantially returned to that of the initial state, as same as the above, repeatedly applying the voltage pulse −4V of the negative polarity, the resistance hysteresis curve line is introduced. This result is shown in FIG. 8B. As shown in FIG. 8B, the resistance value is scarcely changed from the initial state of $8\times10^{-3}\Omega$ till the vicinity of the cumulative pulse applying time $3\times10^{-6}$ seconds; the resistance value begins to rise from the vicinity passing the cumulative pulse applying time $3\times10^{-6}$ seconds; and it is increased to the maximum resistance value at the cumulative pulse applying time $5\times10^{-5}$ seconds. However, the resistance value is only increased to $2.5\times10^4\Omega$. Then, the resistance value is gradually decreased to about $1.0\times10^3\Omega$ at the cumulative pulse applying time $2\times10^{-3}$ seconds. In the meantime, the resistance measurement voltage converting the each resistance value from the I-V characteristic is 0.8 V.

As shown in FIG. 8, in the resistance hysteresis curve line introduced by applying the negative polarity voltage pulse of the first time (FIG. 8A) and in the resistance hysteresis curve line introduced by applying the negative polarity voltage pulse of the second time returning the resistance value to that of the initial state after passing through the maxim point of the resistance hysteresis curve line (FIG. 8B), the results are remarkably different.

Figure 9B:
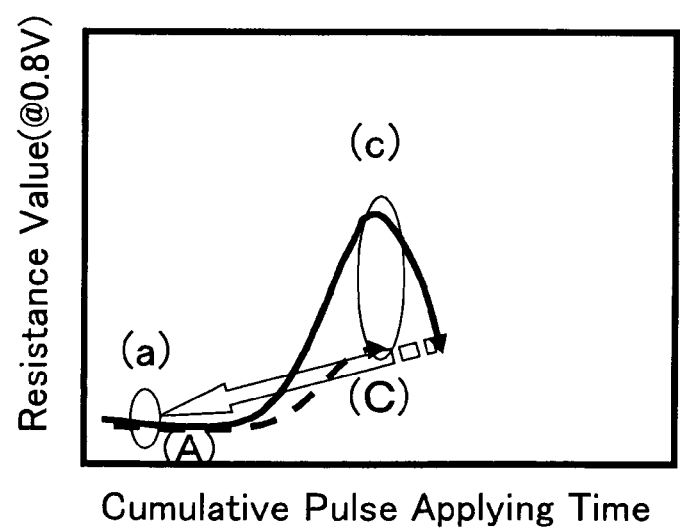
FIG. 9B is a resistance hysteresis characteristic diagram synthesizing the two resistance hysteresis characteristic curve lines in FIG. 8.

In addition, FIG. 9A shows four I-V characteristic in total of two cumulative pulse applying times at a low resistance state and a high resistance state of the variable resistance elements of the two resistance hysteresis curve lines shown in FIGS. 8A and 8B. The I-V characteristic at the initial state before applying the voltage pulse at the first time is represented by a curve line a. Applying the negative polarity voltage pulse of −4V at the first time, the I-V characteristic at the specific cumulative pulse applying time when the resistance hysteresis curve line reaches the maximum point is represented by a curve line c. In addition, the I-V characteristic when the resistance value is substantially returned to that of the initial state applying the positive polarity voltage pulse of +4V is represented by a curve line A, and the I-V characteristic at the cumulative pulse applying time when the resistance hysteresis curve line reaches the maximum point applying the negative polarity voltage pulse at the second time of −4 V once again is represented by a curve line C. FIG. 9B shows a measurement point on the resistance hysteresis curve line in this case. Four I-V characteristic shown in FIG. 9A are identical to the I-V characteristic at four measurement points shown in FIG. 9B. As shown in FIG. 9A, the curve line a and the curve line A are shaped in the substantially same forms. However, they are different from the curve line c and the curve line C at the high resistance state, so that it is found that the nonlinear characteristic of the curve line C is represented more remarkably. In other words, if the cumulative pulse applying time is extended to the point where the resistance value is decreased across the maximum point (the specific cumulative pulse applying time) where the resistance value changing rate of the resistance hysteresis curve line becomes negative from positive, even if the voltage pulse of the inverse polarity is applied to make the resistance value into the low resistance state of the initial state, in the resistance hysteresis curve line that is obtained by applying the negative polarity voltage pulse once again, the cumulative pulse applying time at the maximum point, and the resistance value and the I-V characteristic at the maximum point are changed. In other words, by making the cumulative pulse applying time of the voltage pulse to be applied to the variable resistance element longer than the specific cumulative pulse applying time, it is expected that any change is observed in the characteristic of the variable resistance element.

From discovery of such new characteristic of the variable resistance element, the inventors of the present invention have made the present method and the present unit relating to the variable resistance element, which are described below.

Figure 10:
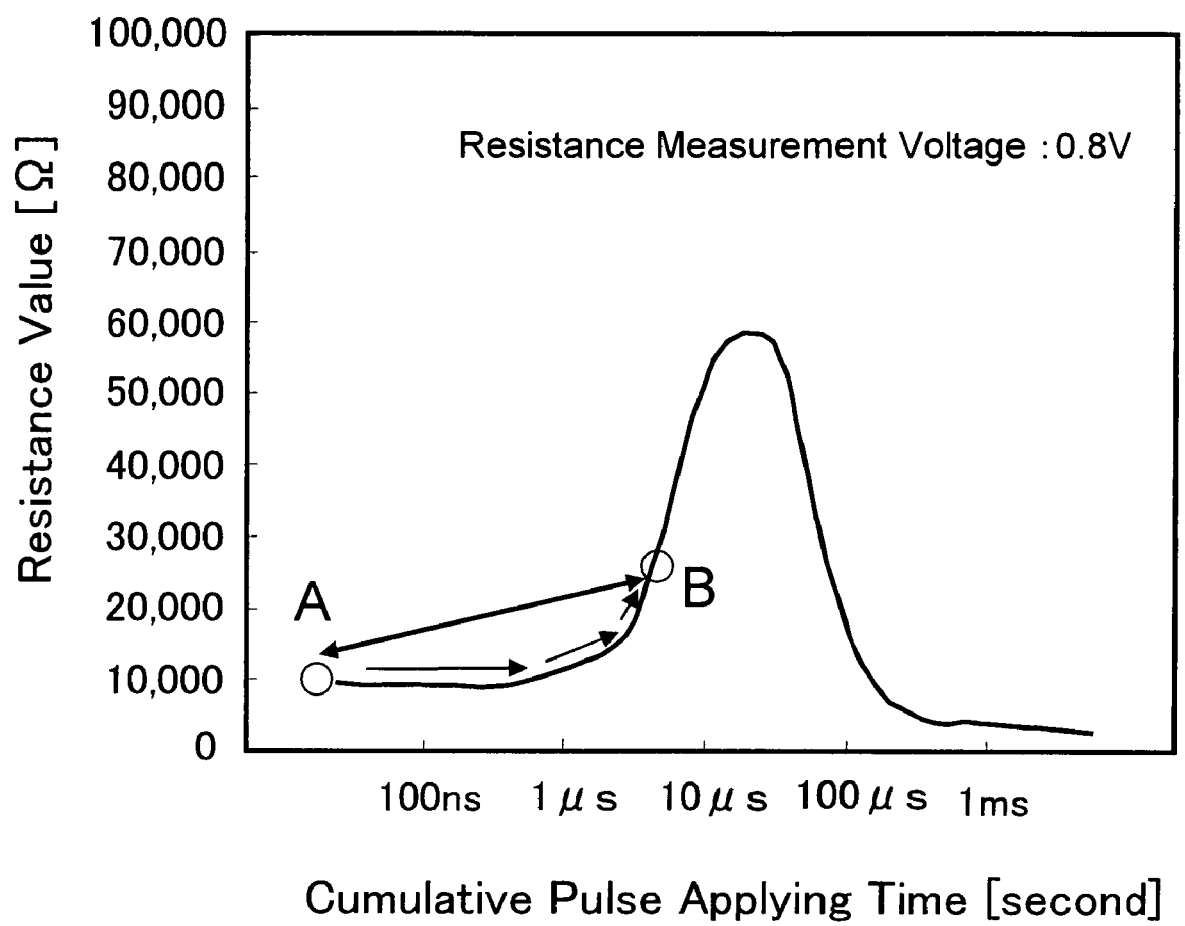
FIG. 10 is a resistance hysteresis characteristic diagram explaining an example of the switching operation of the variable resistance element in the driving method of the variable resistance element according to the present invention.

FIG. 10 is a diagram explaining an example of the switching operation of the variable resistance element in the method according to the present invention when the voltage pulse is applied to the variable resistance element on the basis of the resistance hysteresis characteristic of the variable resistance element.

The variable resistance element manufactured according to the above-described method is in the low resistance state A (about $1.0 \times 10^4 \Omega$) before the voltage pulse is applied. In order to make the variable resistance element from this state into the high resistance state, for example, the resistance value of $2.5 \times 10^4 \Omega$, the pulse width of the single voltage pulse is set at $3\mu$ seconds that is not more than the specific cumulative pulse applying time of the resistance hysteresis characteristic ($50\mu$ seconds according to the embodiment shown in FIG. 10). In other words, by setting the pulse width of the negative polarity voltage pulse of the applying voltage of $-4V$ at $3\mu$ seconds, it is possible to make the variable resistance element into a high resistance state B.

In addition, by applying the positive polarity voltage pulse of the applying voltage $+4V$, it is possible to return the variable resistance element to the low resistance state A once again. Here, by setting the pulse width of the negative polarity voltage pulse at $3\mu$ seconds, it is possible to make the variable resistance element into the high resistance state B. In other words, the resistance value is changed between the low resistance state A and the high resistance state B in a reversible fashion, and each resistance value at the value of the resistance hysteresis curve line has been maintained till the voltage pulse is applied in the next place.

According to the present embodiment, the pulse width is set at $3\mu$ seconds, however, a desirable resistance value may be used by consecutively applying the voltage pulse with the pulse width $1\mu$ seconds three times.

Figure 11A:
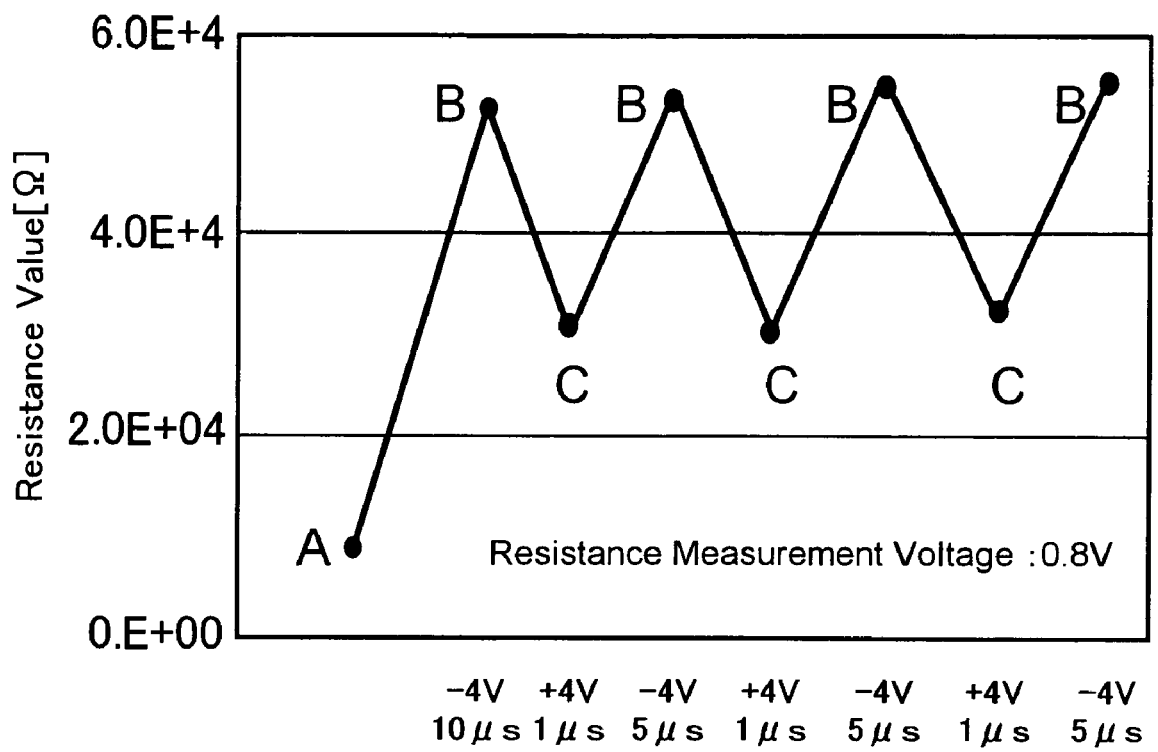
FIG. 11A illustrates application of a voltage pulse of positive and negative polarities to the variable resistance element and the resistance change in the driving method of the variable resistance element according to the present invention.
Figure 11B:
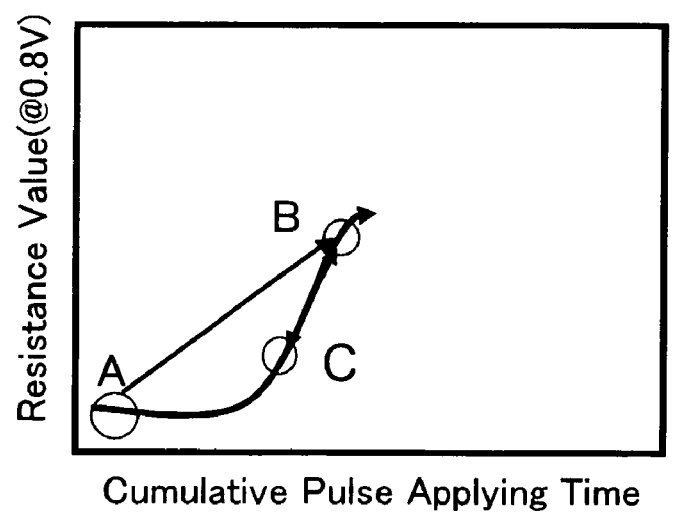
FIG. 11B is a resistance hysteresis characteristic diagram explaining the switching operation shown in FIG. 11A.

In the next place, FIG. 11A shows the change of the resistance value when the positive polarity voltage pulse of the applying voltage of $4V$ with the pulse width $1\mu$ seconds and the negative polarity voltage pulse of the applying voltage of $-4V$ with the pulse width $5\mu$ seconds are alternately applied after applying the negative polarity voltage pulse of the applying voltage of $-4V$ to the variable resistance element that is manufactured by the above-described manufacturing method at the pulse width of $10\mu$ seconds. In FIG. 11A, before applying the voltage pulse, the variable resistance element is made in the low resistance state in the initial state (about $1.0 \times 10^4 \Omega$), namely, the low resistance state A on the resistance hysteresis curve line shown in FIG. 11B. Then, by applying the negative polarity voltage pulse of the applying voltage $-4V$ with the pulse width of $10\mu$ seconds, the resistance state is changed into the high resistance state ($5.5 \times 10^4 \Omega$). In other words, it is possible to make the resistance state into the high resistance state B in the vicinity of the area where the resistance value changing rate of the resistance hysteresis curve line is changed from positive into negative. By continuously applying the positive polarity voltage pulse of the applying voltage $4V$ with the pulse width 1a seconds, the resistance value is changed into about $3.0 \times 10^4 \Omega$, namely, the resistance value changing rate of the resistance hysteresis curve line moves into the low resistance state C that is located at the center portion of the positive area or is located close to the low resistance side rather than the center portion thereof Moreover, by alternately applying the positive polarity voltage pulse of the applying voltage of $4V$ with the pulse width $1\mu$ seconds and the negative polarity voltage pulse of the applying voltage of $-4V$ with the pulse width $5\mu$ seconds, the resistance value of the variable resistance element is changed between the high resistance state B and the low resistance state C.

As stated above, as shown in FIG. 10, the switching operation using the resistance hysteresis characteristic can be made between the low resistance state A in the initial state and the high resistance state B at the inclined area of the resistance hysteresis curve line showing the positive resistance changing rate. However, as shown in FIG. 11, it is also possible to set both the high resistance state B and the low resistance state C of the switching operation in the inclined area showing the positive resistance changing rate of the resistance hysteresis curve line.

Figure 12:
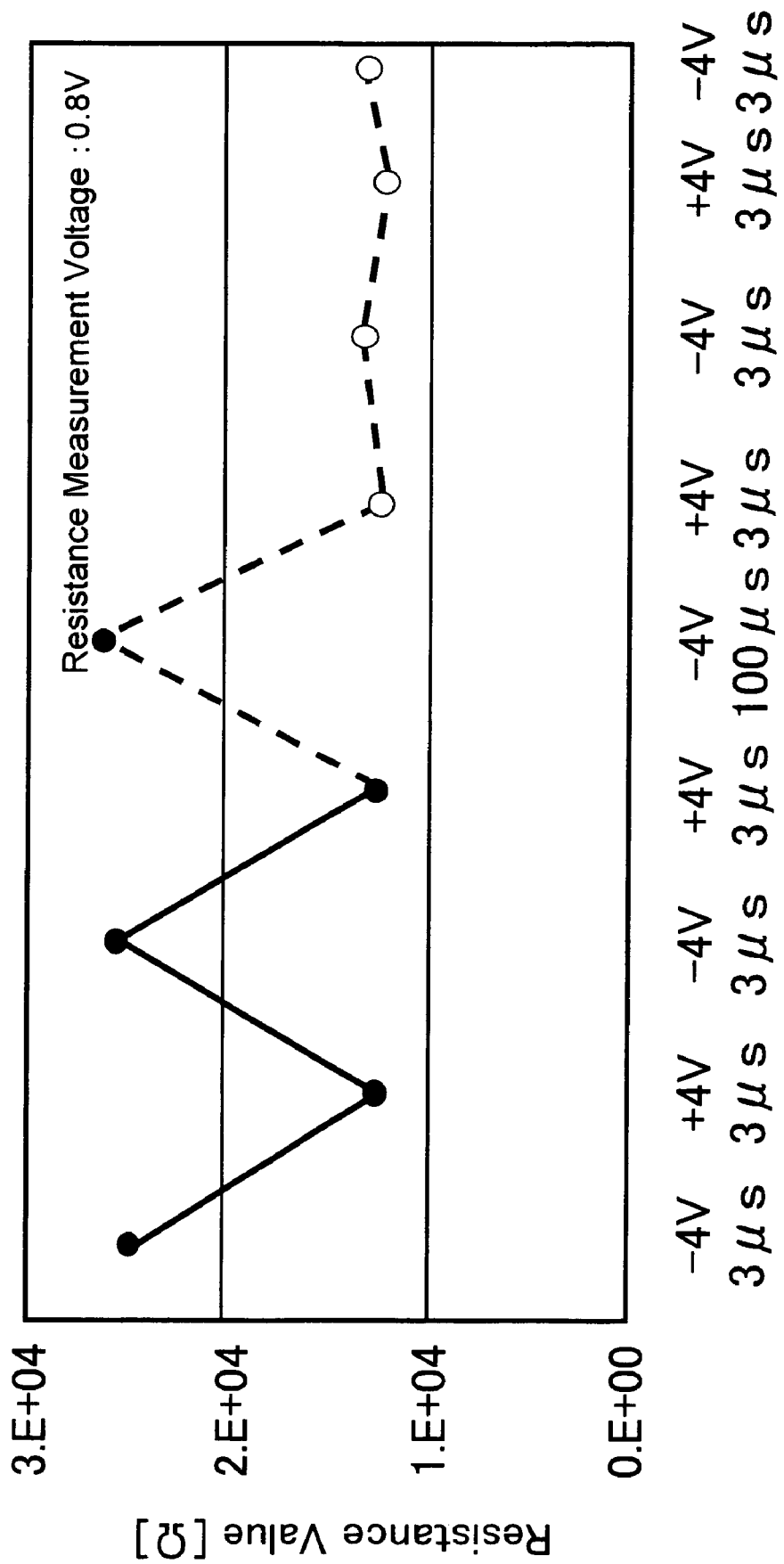
FIG. 12 illustrates application of a voltage pulse of positive and negative polarities to the variable resistance element and the resistance change for explaining the reversibility and the no reversibility of the resistance hysteresis characteristic of the variable resistance element.

FIG. 12 illustrates the resistance change when alternately applying the positive polarity voltage pulse and the negative polarity voltage pulse with the pulse widths $3\mu$ seconds to the variable resistance element by a solid line. As explained with reference to FIG. 10, the resistance state is made into the high resistance state (about $2.5 \times 10^4 \Omega$) by applying the negative polarity voltage pulse, and due to the continuously applied positive polarity voltage pulse, it is possible to make the resistance state into the low resistance state (about $1.2 \times 10^4 \Omega$). In each resistance state, its resistance state has been maintained till the next voltage pulse is applied. This means that the variable resistance element can carry out the switching operation as a nonvolatile memory element. In the meantime, according to the embodiment shown in FIG. 12, differently from the embodiments that have been described above, the resistance value is changed from the low resistance statue in the initial state into the high resistance state by applying the positive polarity voltage pulse.

The above-described switching operation can be continued depending on the same voltage pulse applying condition, however, the characteristic when the cumulative pulse applying time of the voltage pulse is longer than the specific cumulative pulse applying time of the resistance hysteresis characteristic is confirmed and this will be described below.

In FIG. 12, after the stable switching operation due to the application of the voltage pulses $-4V/+4V$ of the opposite polarities, the negative polarity voltage pulse with the pulse width $100\mu$ seconds that is longer than the specific cumulative pulse applying time of the resistance hysteresis characteristic is applied. Even when the negative polarity voltage pulse is applied at this long applying time, it is possible to make the resistance state into the high resistance state B ($2.5 \times 10^4 \Omega$). In the next place, by applying the voltage pulse of the positive polarity (the applying voltage $+4V$) at the pulse width $3\mu$ seconds, it is possible to return the resistance state into the low resistance state ($1.0 \times 10^4 \Omega$) once again. However, it is found that, even if the voltage pulse of the negative polarity (the applying voltage $-4V$) is set at the pulse width $3\mu$ seconds to be applied, the resistance value is only made into the value close to the low resistance state about $1.3 \times 10^4 \Omega$ ($1.0 \times 10^4 \Omega$) and it is not possible to make the resistance state into the high resistance state (about $2.5 \times 10^4 \Omega$). Even applying the voltage pulses of the positive and negative polarities hereinafter, the resistance value is only varied from $1.2 \times 10^4 \Omega$ to $1.4 \times 10^4 \Omega$, so that it is not possible to make the resistance state into the high resistance state about the same as the switching operation that is not longer than the specific cumulative pulse applying time of the resistance hysteresis characteristic.

Accordingly, by setting the pulse width of the voltage pulse to be applied to the variable resistance element used in the present embodiment to not more than the specific cumulative pulse applying time of the resistance hysteresis characteristic (namely, the cumulative pulse applying time from the initial state to the maximum point), it is possible to change the resistance value of the variable resistance element in a reversible fashion. In the case of configuring the nonvolatile memory cell by using such a variable resistance element, when the pulse width of the writing voltage pulse for writing the data is set to not more than the specific cumulative pulse applying time of the resistance hysteresis characteristic and the writing data is cleared, a erasing voltage pulse of an inverse polarity of the writing voltage pulse may be applied. Due to such setting, it is possible to provide a nonvolatile memory device capable of alternately writing and erasing.

In the next place, a voltage dependency of the resistance hysteresis characteristic of the variable resistance element will be described below with reference to FIG. 13.

Figure 13:
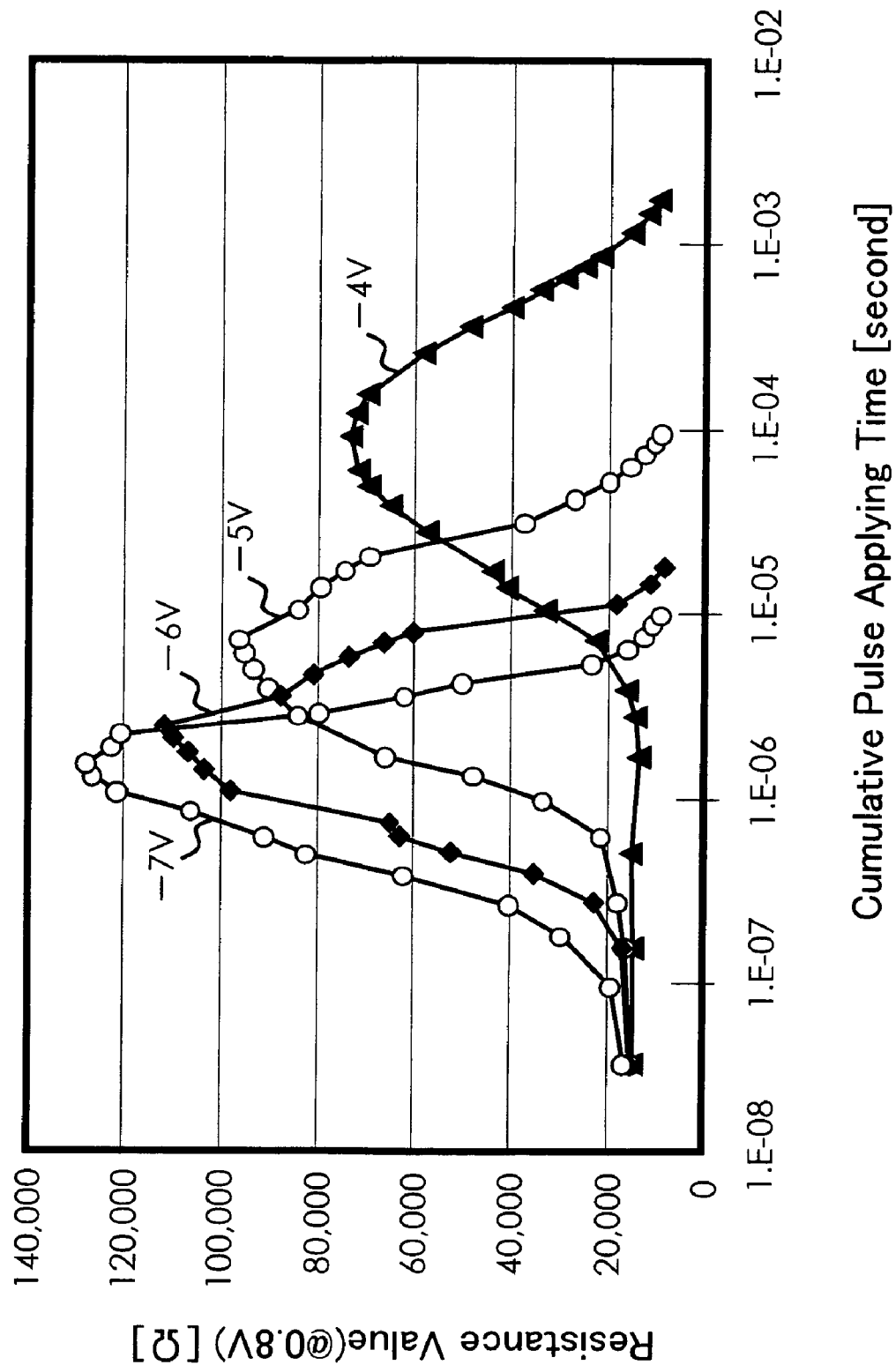
FIG. 13 is a resistance hysteresis characteristic diagram showing a relation between the resistance value of the variable resistance element and cumulative pulse applying time of the applying voltage pulses with the voltage amplitude of a voltage pulse defined as a parameter.

With reference to the variable resistance element of a basic structure shown in FIG. 1, according to the same method as that of measuring the resistance hysteresis curve line shown in FIG. 3, the resistance hysteresis curve line measured while changing the applying voltage of the voltage pulse into $-4.0$ V, $-5.0$ V, $-6.0$ V, and $-7.0$ V is shown in FIG. 13.

According to the variable resistance element in the embodiment shown in FIG. 13, the following resistance hysteresis curve lines are measured depending on the voltage of the applying voltage pulse.

At the voltage pulse of the applying voltage $-4.0$ V, the resistance value begins to rise from the vicinity of the cumulative pulse applying time $4 \times 10^{-6}$ seconds. Then, at the cumulative pulse applying time $1 \times 10^{-4}$ seconds, the resistance value is made into the maximum resistance value $72000\Omega$. After that, by continuously applying the voltage pulse, the resistance value begins to lower and at the cumulative pulse applying time $1.0 \times 10^{-3}$ seconds, the resistance value is made into $1.5 \times 10^4 \Omega$ and the resistance hysteresis curve line that is the resistance value of substantially the initial state is acquired.

At the voltage pulse of the applying voltage $-5.0$ V, the resistance value begins to rise from the vicinity of the cumulative pulse applying time $2 \times 10^{-7}$ seconds. Then, at the cumulative pulse applying time $7.0 \times 10^{-6}$ seconds, the resistance value is made into the maximum resistance value $9.8 \times 10^4 \Omega$. After that, by continuously applying the voltage pulse, the resistance value begins to lower and at the cumulative pulse applying time $6.0 \times 10^{-5}$ seconds, the resistance value is made into $1.5 \times 10^4 \Omega$ and the resistance hysteresis curve line that is the resistance value of substantially the initial state is acquired.

At the voltage pulse of the applying voltage $-6.0$ V, the resistance value begins to rise from the vicinity of the cumulative pulse applying time $1 \times 10^{-7}$ seconds. Then, at the cumulative pulse applying time $2 \times 10^{-6}$ seconds, the resistance value is made into the maximum resistance value $1.1 \times 10^5 \Omega$. After that, by continuously applying the voltage pulse, the resistance value begins to lower and at the cumulative pulse applying time $1.0 \times 10^{-5}$ seconds, the resistance value is made into $1.8 \times 10^4$ $\Omega$ and the resistance hysteresis curve line that is the resistance value of substantially the initial state is acquired.

At the voltage pulse of the applying voltage $-7.0$ V, the resistance value begins to rise from the vicinity of the cumulative pulse applying time $1 \times 10^{-7}$ seconds. Then, at the cumulative pulse applying time $1 \times 10^{-6}$ seconds, the resistance value is made into the maximum resistance value $1.3 \times 10^5 \Omega$. After that, by continuously applying the voltage pulse, the resistance value begins to lower and at the cumulative pulse applying time $6.0 \times 10^{-6}$ seconds, the resistance value is made into $1.5 \times 10^4 \Omega$ and the resistance hysteresis curve line that is the resistance value of substantially the initial state is acquired.

As shown in FIG. 13, it is found that, if a voltage amplitude of the applying voltage pulse is high, the resistance value also tends to be increased and the specific cumulative pulse applying time till the maximum value tends to be made short. Accordingly, it is found that the stable switching operation cannot be acquired unless the voltage pulse that is set at a pulse width shorter than the specific cumulative pulse applying time in the resistance hysteresis characteristic in accordance with the voltage amplitude of the applying voltage pulse is applied.

Figure 14:
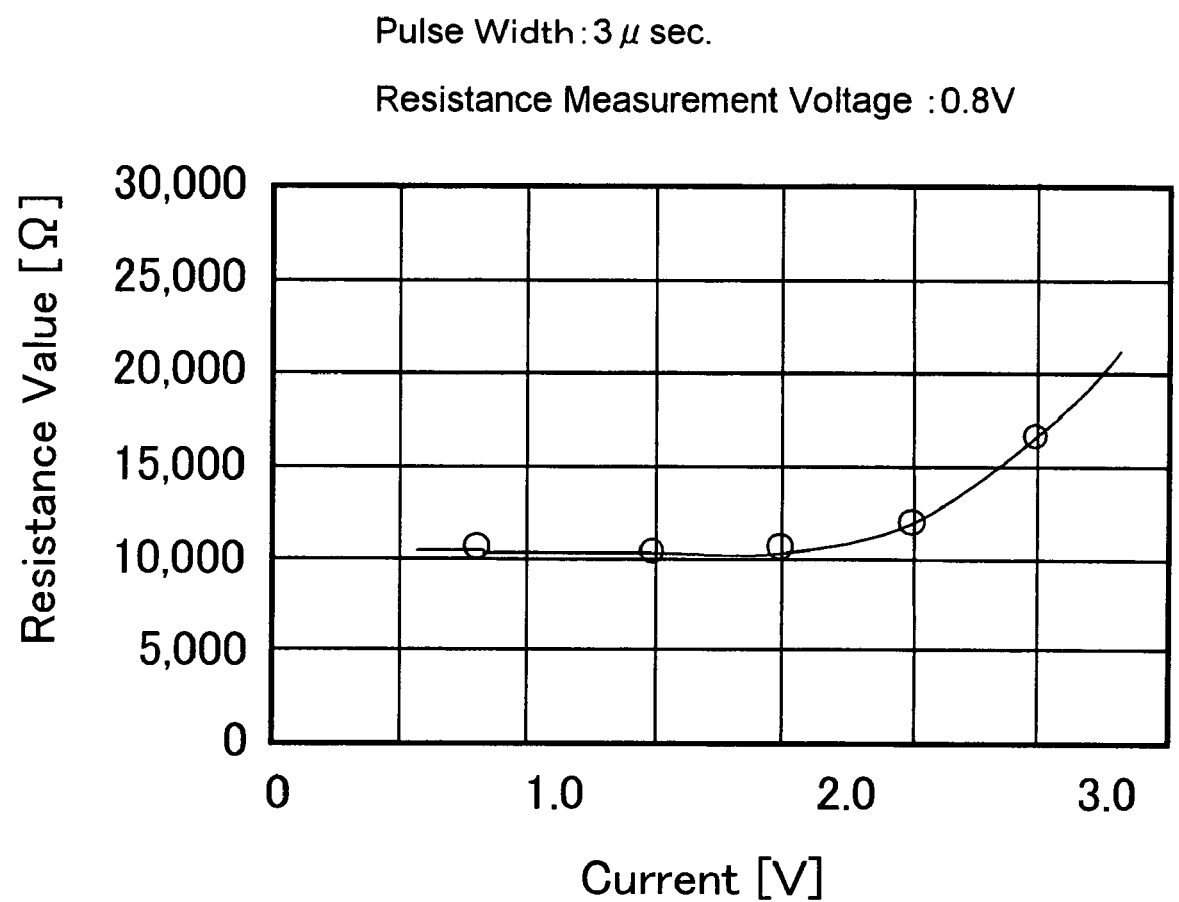
FIG. 14 illustrates a relation between the resistance value of the variable resistance element and the voltage amplitude of the applying voltage pulse.

In the next place, FIG. 14 shows a relation between the resistance value and the voltage amplitude (an absolute value) when applying a single voltage pulse of the pulse width $3\mu$ seconds. In FIG. 14, the resistance measurement voltage when converting the resistance value from the I-V characteristic is 0.8 V. According to the example shown in FIG. 14, it is found that the resistance value is scarcely changed when the voltage amplitude is not more than 2.0 V, however, if the voltage amplitude is higher than 2.5 V, the resistance value begins to be largely increased. Accordingly, it is found that, in order to use in the present embodiment as the variable resistance element, the voltage amplitude of the voltage pulse should be set to not less than 2.5 V According to the present embodiment, the voltage of about 2.5 V is a threshold voltage of the voltage amplitude capable of carrying out the writing operation. In the meantime, according to the present embodiment, the a threshold voltage that the resistance value begins to be changed is not less than 2.5 V and it is known that this threshold voltage is changed due to change of the manufacturing process of the variable resistance element and the configuration of the element. In the case of configuring the memory device by forming a memory cell using the variable resistance element according to the present invention, a further lower threshold voltage is preferable in consideration of low power consumption in respective operations such as integration of the memory cell, and writing, erasing, and reading of the memory cell. In addition, according to the present embodiment, in order to introduce the resistance value of the variable resistance element, measurement of the resistance is carried out at the voltage 0.8V, however, the resistance measurement voltage may be not more than the threshold voltage.

In other words, in the case of configuring the memory device by forming the memory cell using the variable resistance element, by applying the voltage having the amplitude not less than the threshold voltage as the writing voltage pulse, it is possible to change the resistance value. In addition, by making the pulse width shorter than the specific cumulative pulse applying time of the resistance hysteresis characteristic, it is possible to repeatedly write or erase the data in the memory cell, so that it is possible to read the memory cell at the voltage amplitude not more than the threshold voltage without having effects on the resistance value of the memory data.

The resistance hysteresis characteristic indicated by the variable resistance element in the case of continuously applying the negative polarity voltage pulse from the initial state will be mainly described above. Hereinafter, the resistance hysteresis characteristic indicated by the variable resistance element in the case of continuously applying the positive polarity voltage pulse from the initial state will be described below.

Figure 15:
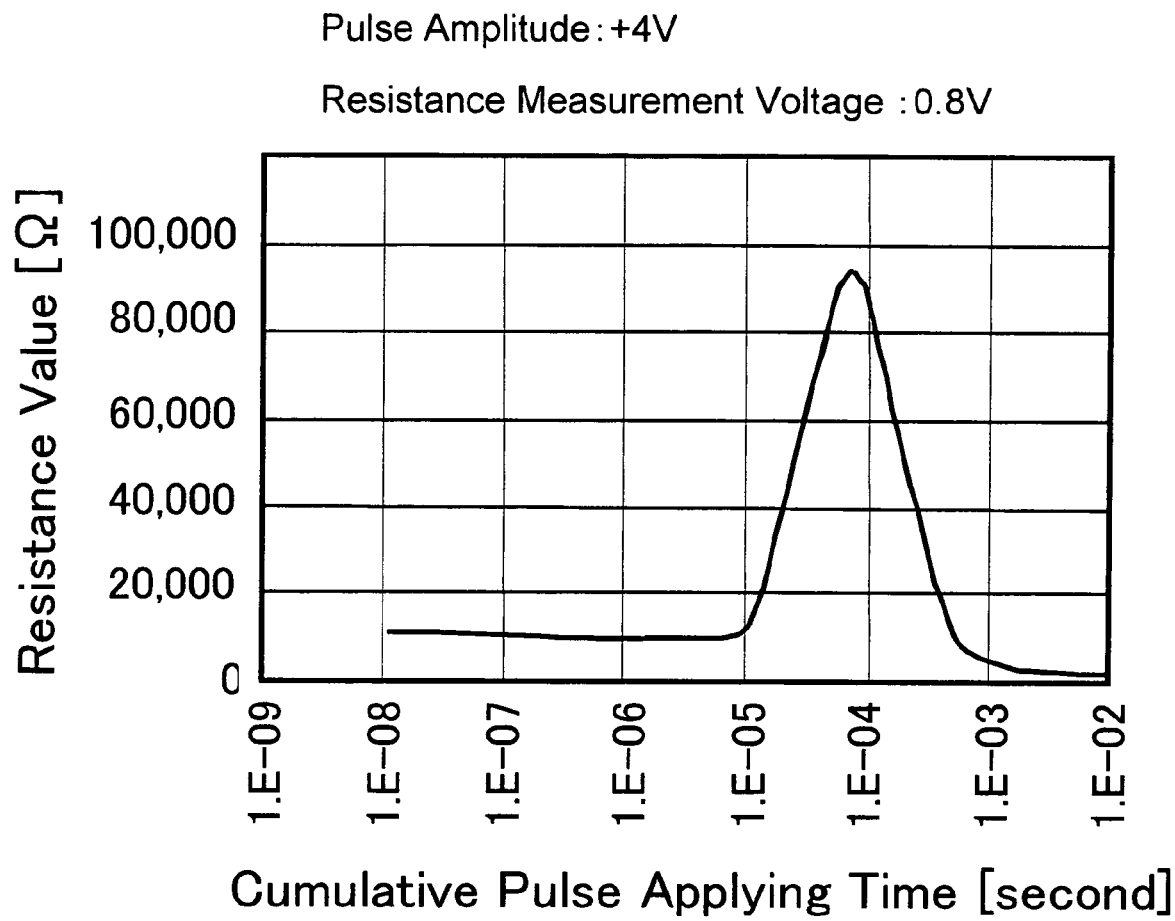
FIG. 15 is a resistance hysteresis characteristic diagram showing a relation between the resistance value of the variable resistance element and the cumulative pulse applying time of the applied positive polarity voltage pulse.

FIG. 15 show a result of applying the voltage pulse of the positive polarity applying voltage +4V to the variable resistance element by using the same sample as that used for measuring the resistance hysteresis characteristic shown in FIG. 3.

By applying the voltage pulse of the positive polarity applying voltage +4V in place of the voltage pulse of the negative polarity applying voltage −4V to the basic structure of the variable resistance element shown in FIG. 1 to make the configuration thereof the same as that when measuring the resistance hysteresis characteristic shown in FIG. 3, the resistance hysteresis characteristic is measured. As shown in FIG. 15, it is found that the resistance hysteresis characteristic having the resistance hysteresis curve line formed in a mountain as same as that when applying the negative polarity voltage pulse can be acquired. However, the resistance value begins to be increased from the cumulative pulse applying time of $1.0 \times 10^{-5}$ seconds and the resistance value is made into $9.3 \times 10^{4} \Omega$ when the specific cumulative pulse applying time as the maximum point is $9.0 \times 10^{-5}$ seconds. As a result, the resistance value in this case is different from that when applying the negative polarity voltage pulse.

In addition, also in the case of applying the positive polarity voltage pulse, as same as the case of applying the negative polarity voltage pulse, the switching operation can be confirmed by setting the pulse width of the voltage pulse applied to the variable resistance element used in the present embodiment at the specific cumulative pulse applying time of the resistance hysteresis characteristic or shorter. In other words, by applying the voltage pulse of the positive polarity (the applying voltage +4V) from the initial state at first, the resistance value is made into the high resistance state tracing the resistance hysteresis curve line. Next, by applying the voltage pulse of the negative polarity (the applying voltage −4V) that is the opposite polarity, the resistance state is returned to the low resistance state of the initial state.

Therefore, according to the method of the present invention, due to the polarity of the voltage pulse to be applied at first, it is possible to control the polarity of the voltage pulse to make the variable resistance element into the high resistance state when applying the negative polarity voltage pulse and make the variable resistance element into the low resistance state when applying the voltage pulse.

In the next place, a unit of the present invention using the variable resistance element having a very discriminative resistance hysteresis characteristic described above in detail will be described below.

Figure 16:
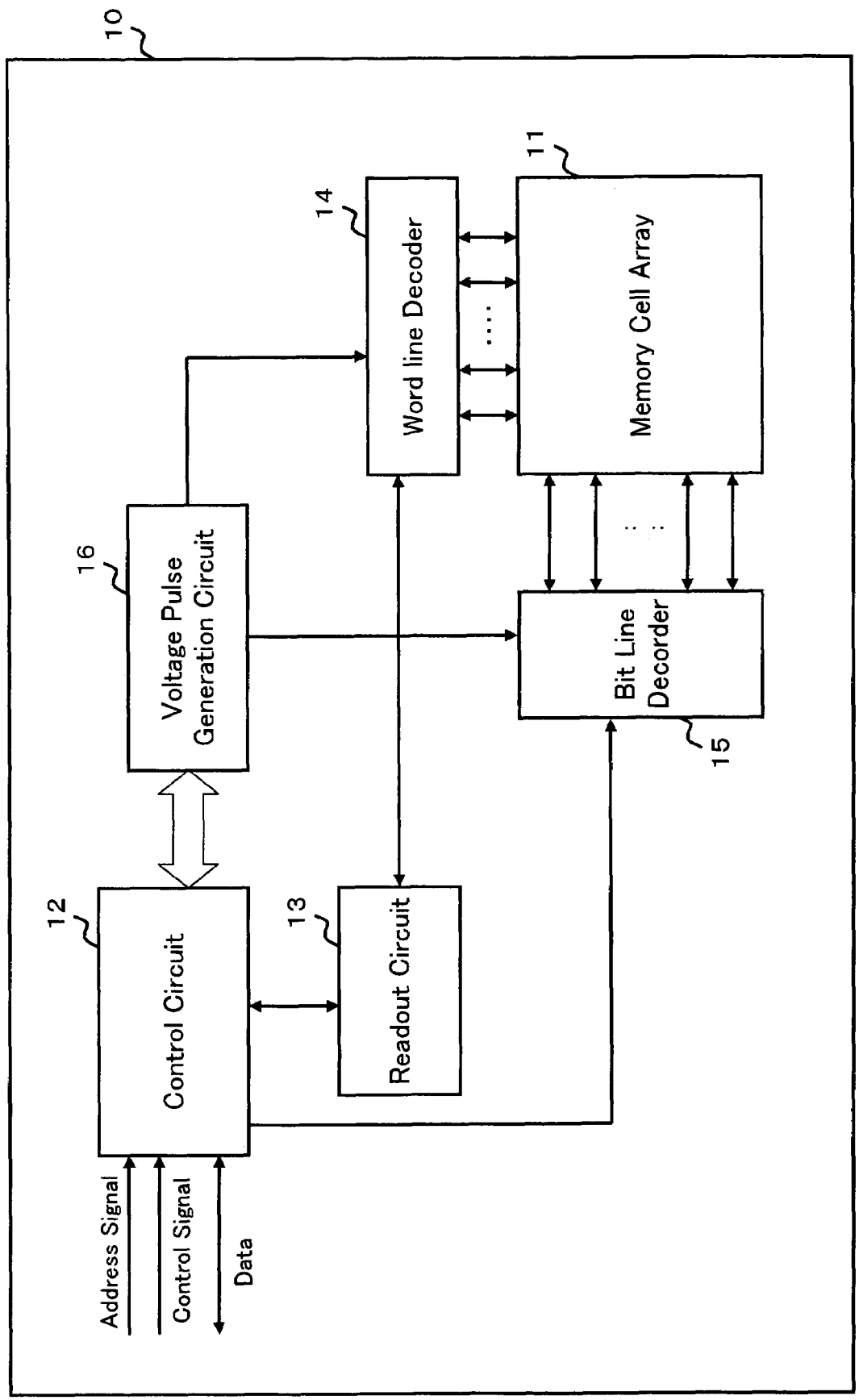
FIG. 16 is a block diagram showing a block schematic structure according to an embodiment of the memory device of the present invention.

FIG. 16 shows a block schematic structure according to an embodiment of a memory device 10 of the present invention. As shown in FIG. 16, the memory device 10 of the present invention is provided with a memory cell array 11 configured by arranging the memory cell having the variable resistance elements in a matrix in row and column directions and the memory device 10 can stored the data in each memory cell due to change of the resistance value of the variable resistance element and can read the data. In detail, the memory cell array 11 is configured by connecting the lower electrodes of the variable resistance elements of respective memory cells that are arranged in the same column each other and extending them in the column direction to form a bit line and connecting the upper electrodes of the variable resistance elements of respective memory cells that are arranged in the same row to a common word line extended in the row direction. Accordingly, in the present embodiment, the formation such that the memory cell is only provided with the variable resistance element and it is not provided with an element such as a selection transistor for selecting a memory cell is illustrated, however, for example, the memory cell may be configured by the variable resistance element and the selection transistor.

As shown in FIG. 16, the memory device 10 according to the present invention is provided with a control circuit 12, a reading circuit 13, a word line decoder 14, a bit line decoder 15, and a voltage pulse generation circuit 16, as peripheral circuits of the memory cell array 11.

The control circuit 12 may control writing, erasing, and reading of the data in the memory cell array 11. The data is stored in the specific memory cell within the memory cell array 11 in accordance with an address signal, and the data is outputted to an external apparatus via the reading circuit 13. The control circuit 12 may control the word line decoder 14, the bit line decoder 15, and the voltage pulse generation circuit 16 based on the address signal, a data input at the time of writing, and a control signal so as to control the reading operation, the writing operation, and the erasing operation of the memory cell array 11. According to the example shown in FIG. 16, the control circuit 12 is provided with the functions as general address buffer circuit, data input and output buffer circuit, and control input buffer circuit (not illustrated).

The word line decoder 14 is connected to each word line of the memory cell array 11 to select the word line of the memory cell array 11 corresponding to the address signal, and the bit line decoder 15 is connected to each bit line of the memory cell array 11 to select the bit line of the memory cell array 11 corresponding to the address signal.

The voltage pulse generation circuit 16 may generate each voltage of the bit line and the word line necessary for the reading operation, the writing operation, and the erasing operation of the memory cell array 11. Upon the writing operation, each voltage of the bit line and the word line are set so that the voltage pulse of a larger voltage than the threshold voltage is applied only between the upper electrode and the lower electrode of the variable resistance element of the memory cell that is selected by the address signal. Then, each voltage is applied to a selection and no-selection bit line and a selection and no-selection word line from the voltage pulse generation circuit 16 via the bit line decoder 15 and the word line decoder 14, respectively. In the writing voltage pulse, the applying time is controlled at the pulse width set by the control circuit 12, and then, the writing voltage pulse is applied to the variable resistance element of the selection memory cell to carry out the writing. Here, it is necessary that the pulse width is made shorter than the specific cumulative pulse applying time of the resistance hysteresis characteristic of the variable resistance element because the present unit is not operated as the memory device that can be repeatedly written when the pulse width is long.

According to the present embodiment, an example of applying the voltage pulse of the voltage amplitude larger than the threshold voltage only to the variable resistance element of the selection memory cell and selectively writing the data so that no voltage over the threshold voltage is applied to the variable resistance element of other no-selection memory cell will be described below. In this case, the case that the threshold voltage is 2.5 V, the voltage amplitude of the writing voltage pulse is 4V, and the pulse polarity is the positive polarity is assumed.

At first, the middle voltage 2V lower than the threshold voltage is applied to the all word lines and bit lines. Under this state, the voltage is not applied to all memory cells yet. In the next place, the applying voltage of the selection bit line is lowered to an earth potential. At this point, the middle voltage of 2V is applied to the variable resistance element of one column of memory cells connected to the selection bit line, however, the data is not written at this applying voltage. Next, the applying voltage of the selection word line is increased to 4V at the set pulse width. As a result, the voltage 4V and the voltage 2V are applied to the upper electrode and the lower electrode, respectively, of the variable resistance element of the no-selection memory cell connected to the selection word line and the no-selection bit line, so that 2V is applied to the variable resistance element as a voltage difference and no data is written. On the contrary, 4V and 0V are applied to the upper electrode and the lower electrode, respectively, of the variable resistance element of the selection memory cell connected to the selection word line and the no-selection bit line only for the applying time set by the pulse width and the voltage amplitude 4V is higher than the threshold voltage, so that the data is written in accordance with the resistance hysteresis characteristic.

In the meantime, the middle voltage may be different at the word line side and the bit line side. In other words, the middle voltage to be applied to the word line or the bit line at the side of applying the writing voltage pulse is made ⅓ of the voltage amplitude of the writing voltage pulse and the middle voltage to be applied to the word line or the bit line at other side is made ⅔ of the voltage amplitude of the writing voltage pulse, and this leads to make the voltage applied to the variable resistance element of the no-selection memory cell into ⅓ of the voltage amplitude so as to more reduce the voltage stress to the no-selection memory cell.

According to the present embodiment, with respect to the specific cumulative pulse applying time of the resistance hysteresis characteristic of 100μ seconds, the case that the pulse width is 3μ seconds, the threshold voltage is 2.5 V, and the voltage amplitude of the writing voltage pulse is 4V is assumed, however, the different applying voltage and pulse width are selected depending on variation of the material, the composition, the manufacturing method, and the element structure of the variable resistance element.

In the next place, the erasing operation will be described below. The operation for selecting a memory cell and erasing the data written into this memory cell is basically identical with the above-described writing operation. A different point is that the polarity of the erasing voltage pulse to be applied to the variable resistance element of the selection memory cell is reverse of that of the writing voltage pulse. Accordingly, in the present embodiment, as the erasing voltage pulse, for example, the negative polarity voltage pulse of the applying voltage −4V, which is reverse of the writing voltage pulse, is applied at the pulse width 3μ seconds. In the meantime, the voltage amplitude and the pulse width of the erasing voltage pulse are not necessarily set identical with the voltage amplitude and the pulse width of the writing voltage pulse as long as the resistance state is low.

Next, the reading operation will be described below. Upon reading of the data from the memory cell, the reading voltage lower than the threshold voltage is applied between the upper electrode and the lower electrode of the variable resistance element of the memory cell selected by the address signal. Continuously, the voltage of a memory cell current flowing through the selection memory cell is converted by the word line decoder 14, the reading circuit 13 determines this voltage value, and this determination result is transferred to the control circuit 12 to be outputted to the outside. In the meantime, the polarity of the reading voltage may be any of positive or negative.

The reading operation is remarkably varied depending on the structure of the memory cell, for example, with or without of the selection transistor, so that a predetermined voltage is applied from the voltage pulse generation circuit 16 to the selection and no-selection bit lines and the selection and no-selection word lines via the bit line decoder 15 and the word line decoder 14, respectively according to a method adapted to the structure of the memory cell. For example, as an example, 1V lower than the threshold voltage is applied to all word lines and all bit lines, and continuously, the earth voltage is applied to the selection bit line. In this case, the voltage to be applied to the no-selection bit line and the word line voltage are the same, in principle, so that no current is supplied to the memory cell connected to the no-selection bit line. Accordingly, the reading voltage 1V is applied only to the variable resistance element of one column of memory cells connected to the selection bit line and each memory cell provides the writing state of each variable resistance element, namely, the memory cell current in accordance with the resistance state via the word line to which each memory cell is connected. The word line decoder 14 can selectively convert the voltage of the memory cell current flowing on the selected word line and output it to the reading circuit 13. Therefore, if the resistance state of the variable resistance element of the selection memory cell is high, the memory cell current is small and on the contrary, if this resistance state is low, the memory cell current is large, and this leads to read the data by converting the voltage of the current difference.

In the meantime, on the basis of a relation between the voltage amplitude of the voltage pulse and the resistance hysteresis characteristic shown in FIG. 13, by making the voltage amplitude of the writing voltage pulse larger, it is possible to make a difference of resistance value between the low resistance state and the high resistance state larger, so that it is possible to make a margin of the reading operation larger.

Further, with respect to the usage of the memory device requiring the writing operation at a high speed, if the voltage amplitude of the writing voltage pulse to be applied is made larger, the resistance value can be largely changed even by the short pulse width, so that the speed of the writing operation can be increased.

In the next place, the structure of the present unit and the present manufacturing method will be described with reference to the sectional block schematic diagram shown in FIG. 17.

Figure 17:
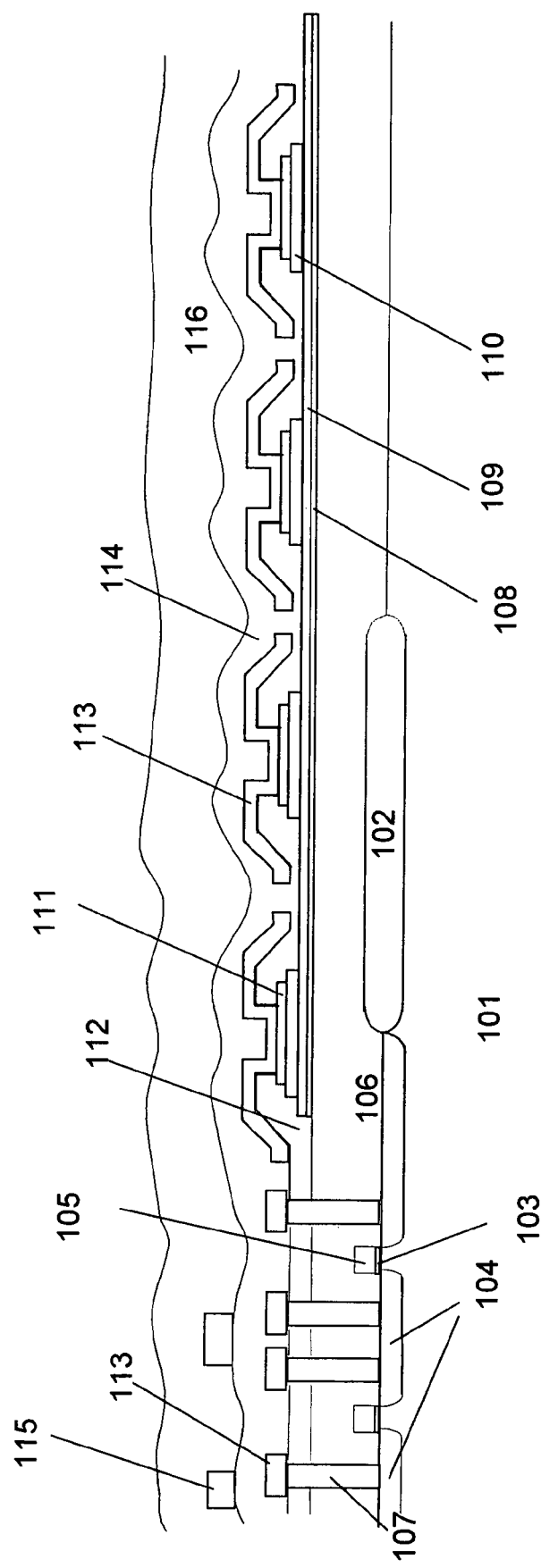
FIG. 17 is a sectional view showing a schematic sectional structure according to the embodiment of the memory device of the present invention.

In FIG. 17, a reference numeral 101 denotes a semiconductor substrate, for example, made of silicon; a reference numeral 102 denotes an element separation area; a reference numeral 103 denotes a gate insulating film; a reference numeral 104 denotes a source and drain diffusion layer; and a reference numeral 105 denotes a gate electrode. In respective parts, a circuit necessary for driving the variable resistance element and a peripheral circuit or the like are incorporated according to the semiconductor manufacturing art.

In addition, a reference numeral 106 on the semiconductor substrate 101 denotes a first inter layer insulating film; a reference numeral 107 denotes a tang stain plug; a reference numeral 108 denotes a contact layer $TiO_x$; a reference numeral 109 denotes a lower electrode formed by Pt or Ir; a reference numeral 110 denotes a PCMO film that is a variable resistance body; a reference numeral 111 denotes an upper electrode formed by Pt or Ir; a reference numeral 112 denotes a second inter layer insulating film; a reference numeral 113 denotes a first wiring formed by Al—Si/TiN/Ti; a reference numeral 114 denotes a third inter layer insulating film; a reference numeral 115 denotes a second wiring formed by Al—Si/TiN/Ti; and a reference numeral 116 denotes a surface protection film.

The manufacturing method of the present unit using the variable resistance element formed by the lower electrode 109, the PCMO film 110, and the upper electrode 111 as a memory cell is as described below.

At first, a transistor configuring a peripheral circuit of the present unit on the semiconductor substrate 101 is formed according to a publicly known method to form the first inter layer insulating film 106 made of BPSG. Next, as the contact layer 108 of the lower electrode 109, a $TiO_x$ film of a film thickness 40 nm is formed according to the sputtering method. After forming the Pt film or the Ir film of the lower electrode 109 with a film thickness 100 to 200 nm on this $TiO_x$ contact layer 108, the PCMO film 110 of a film thickness 100 nm as a variable resistance body is formed by the sputtering method. Specifically, the PCMO film 110 is formed on the substrate by heating the substrate to 300 to 500° C. under a film formation pressure of 5 to 20 mTorr., sputtering a target of a PCMO sintered body by an Ar ion, and reacting it with oxygen introduced as a reacting gas. The deposition of the PCMO film 110 is not limited to the sputtering method, and a CVD method, a So1-Ge method, and an MOD method may be available. On this PCMO film 110, the Pt film or the Ir film of the upper electrode 111 with a film thickness 100 nm is formed by the sputtering method.

Next, according to a publicly known lithography method and dry etching method, the upper electrode 111, the PCMO film 110, and the lower electrode 109 are processed by different masks in series to complete the variable resistance element. On this variable resistance element, the second inter layer insulating film 112 of a film thickness 50 to 60 nm is formed; in order to connect the variable resistance element to the peripheral circuit, a contact hole is opened on the source and drain diffusion layer 104 of the transistor of the peripheral circuit; and the tang stain plug 107 is formed according to the publicly known method. Then, the contact hole is opened only on the upper electrode 111; the Al/TiN/Ti film of the first wiring 113 is formed by the sputtering method; and these parts are processed by the publicly know lithography method and the dry etching method to connect the variable resistance element to the peripheral circuit.

In the meantime, for connection of the variable resistance element and the peripheral circuit, after forming the transistor, a tang stain plug may be formed, or after forming a polysilicon plug, the variable resistance element may be formed. In this case, when securing electric connection of the lower electrode 109 and the tang stain plug 107 or the polysilicon plug, remarkable alloying is caused between Pt and Si. Therefore, it is effective to insert Ti, TiN, $Ti_{1-x}Al_xN$, TaN, TiSiN, and TaSiN or the like having electrical conductivity and a barrier property.

Next, the third inter layer insulating film 114 is formed, a contact hole is opened on the source diffusion layer 104 of the switching transistor, and the Al/TiN/Ti films to be the second wirings 115 deposit by a DC magnetron sputtering method. A structural rate of film thickness is Al/TiN/Ti=500/300/50 nm. Then, according to the publicly known lithography method and the dry etching method, the Al/TiN/Ti film is applied with process patterning to form the second wiring 115. At last, according to a plasma CVD method, a SiN film is formed as the surface protection film 116 and thus, the present unit is completed, which is configured by the variable resistance element and the peripheral circuit.

The driving method of the variable resistance element and the memory device using the variable resistance element as the memory cell were described by representing specific numeric values as above. However, it has been confirmed that the exemplified numeric values are different if the material, the composition, and the structure of the variable resistance element are different, so that the present method and the present unit are not limited to the numeric values exemplified in the above-described embodiment(s).

In addition, the functional structure and the sectional structure of the present unit were specifically described above, however, these structures are merely exemplified and they may be appropriately varied on the basis of a spirit of the present invention.

For example, in the block structure shown in FIG. 16, if a relation between the word line and the bit line of the memory cell array 11 is reversed, the arrangement of the word line decoder 14 and the bit line decoder 15 is also exchanged. In addition, in the structure shown in FIG. 16, the case that the reading data is read via the word line decoder 14 is indicated, however, the reading data may be read via the bit line decoder 15. For example, if the memory cell includes the selection transistor, the word line is connected to the gate electrode of the selection transistor, and this results in reading of the data via the bit line. In the same way, the sectional structure when the memory cell includes the selection transistor is different from the sectional structure shown in FIG. 17.

In addition, in the voltage pulse generation circuit shown in FIG. 16, the voltage pulses for each of the writing operation, the erasing operation, and the reading operation are generated in one circuit block, however, the voltage pulse generation circuit for generating the voltage pulse for each operation separately may be provided respectively. Further, the voltage pulse generation circuit for generating the voltage pulse for reading may be provided within the word line decoder 14 and the bit line decoder 15.

What is claimed is:

1. A driving method of a variable resistance element, the variable resistance element comprising a perovskite-type oxide between a first electrode and a second electrode, of which electric resistance between the first electrode and the second electrode is changed by applying a voltage pulse of a predetermined polarity between the first electrode and the second electrode, and having a resistance hysteresis characteristic, in which a changing rate of a resistance value is changed from positive to negative with respect to increase of a cumulative pulse applying time in the application of the voltage pulse;

wherein the driving method comprises applying the voltage pulse to the variable resistance element on the basis of the resistance hysteresis characteristic and so that the cumulative pulse applying time is not longer than a specific cumulative pulse applying time, on which the changing rate of the resistance value is changed from positive to negative with respect to increase of the cumulative pulse applying time in the resistance hysteresis characteristic.

2. The driving method of a variable resistance element according to claim 1, wherein the specific cumulative pulse applying time is controlled by controlling the voltage amplitude of the voltage pulse.

3. The driving method of a variable resistance element according to claim 1, wherein the resistance value of the variable resistance element after applying the voltage pulse is controlled by controlling the pulse applying time or the cumulative pulse applying time of the voltage pulse.

4. The driving method of a variable resistance element according to claim 1, wherein the resistance value of the variable resistance element is changed reversibly in a positive area of the changing rate of the resistance value with respect to increase of the cumulative pulse applying time in the resistance hysteresis characteristic.

5. The driving method of a variable resistance element according to claim 1, wherein the variable resistance element has the resistance hysteresis characteristic, in which the changing rate of the resistance value is changed from positive to negative with respect to increase of the cumulative pulse applying time in spite of a polarity of the voltage pulse to be applied between the first electrode and the second electrode.

6. The driving method of a variable resistance element according to claim 1, wherein the perovskite-type oxide used for the variable resistance element is an oxide including at least one kind of element selected from among Pr, Ca, La, Sr, Gd, Nd, Bi, Ba, Y, Ce, Pb, Sm, and Dy and at least one kind of element selected from among Ta, Ti, Cu, Mn, Cr, Co, Fe, Ni, and Ga.

7. The driving method of a variable resistance element according to claim 6, wherein the perovskite-type oxide is an oxide of any one group represented by a general formula ($0.1 \leq x \leq 1$, $0 \leq z \leq 1$), which is selected from among a $Pr_{1-x}Ca_x[Mn_{1-z}M_z]O_3$ group (here, M is any element selected from among Ta, Ti, Cu, Cr, Co, Fe, Ni, and Ga); an $La_{1-x}AE_xMnO_3$ group (here, AE is any divalent alkaline-earth metal selected from among Ca, Sr, Pb, and Ba); an $RE_{1-x}Sr_xMnO_3$ group (here, RE is any trivalent rare-earth metal selected from among Sm, La, Pr, Nd, Gd, and Dy); $La_{1-x}Co_x[Mn_{1-z}Co_z]O_3$ group; a $Gd_{1-x}Ca_xMnO_3$ group; and an $Nd_{1-x}Gd_xMnO_3$ group.

8. The driving method of a variable resistance element according to claim 1, wherein the second electrode includes at least one kind of a single piece of noble metal of platinum group metal, an alloy based on the noble metal, an oxide conductive substance of any element selected from among Ir, Ru, Re, and Os; and an oxide conductive substance selected from among SRO ($SrRuO_3$), LSCO (($LaSr$)$CoO_3$), YBCO ($YbBa_2Cu_3O_7$).

9. The driving method of a variable resistance element according to claim 1, wherein the variable resistance element comprises a perovskite-type oxide film on the second electrode; and the first electrode includes at least one kind of a noble metal of platinum group metal, a single piece of metal or its alloy selected from among Ag, Al, Cu, Ni, Ti, and Ta, an oxide conductive substance of any element selected-from among Ir, Ru, Re, and Os; and an oxide conductive substance selected from among SRO ($SrRuO_3$), LSCO (($LaSr$)$CoO_3$), YBCO ($YbBa_2Cu_3O_7$).

10. A memory device comprising:
a memory cell having a variable resistance element which comprises a perovskite-type oxide between a first electrode and a second electrode, and of which electric resistance between the first electrode and the second electrode is changed by applying a voltage pulse between the first electrode and the second electrode; and
a voltage pulse generation circuit for generating the voltage pulse to be applied to the variable resistance element;
wherein the variable resistance element has a resistance hysteresis characteristic, in which a changing rate of a resistance value is changed from positive to negative with respect to increase of a cumulative pulse applying time in the application of the voltage pulse; and
the voltage pulse generation circuit generates the voltage pulse to be applied to the variable resistance element on the basis of the resistance hysteresis characteristic and so that the cumulative pulse applying time is not longer than a specific cumulative pulse applying time, on which the changing rate of the resistance value is changed from positive to negative with respect to increase of the cumulative pulse applying time in the resistance hysteresis characteristic.

11. The memory device according to claim 10, wherein the memory device controls the specific cumulative pulse applying time by controlling the voltage amplitude of the voltage pulse generated by the voltage pulse generation circuit.

12. The memory device according to claim 10, wherein the memory device controls the resistance value of the variable resistance element after applying the voltage pulse by controlling the pulse applying time or the cumulative pulse applying time of the voltage pulse.

13. The memory device according to claim 10, comprising a memory cell array configured by arranging the memory cells in a matrix; wherein the voltage pulse generation circuit is configured so as to be capable of generating a writing voltage pulse of a predetermined polarity and voltage amplitude when writing the data in the memory cell by increasing the resistance value of the variable resistance element; generating an erasing voltage pulse of a predetermined voltage amplitude at a reverse polarity of the writing voltage pulse when erasing the data from the memory cell by decreasing the resistance value of the variable resistance element; and generating a reading voltage pulse smaller than any voltage amplitude at any polarity among the writing voltage pulse and the erasing voltage pulse when reading the memory data of the memory cell by detecting the resistance value of the variable resistance element, separately.

14. The memory device according to claim 10, wherein the memory device changes the resistance value of the variable resistance element in a reversibly in a positive area of the changing rate of the resistance value with respect to increase of the cumulative pulse applying time in the resistance hysteresis characteristic.

15. The memory device according to claim 10, wherein the variable resistance element has the resistance hysteresis characteristic, in which the changing rate of the resistance value is changed from positive to negative with respect to increase of the cumulative pulse applying time in spite of a polarity of the voltage pulse to be applied between the first electrode and the second electrode.

16. The memory device according to claim 10, wherein the perovskite-type oxide used for the variable resistance element is an oxide including at least one kind of element selected from among Pr, Ca, La, Sr, Gd, Nd, Bi, Ba, Y, Ce, Pb, Sm, and Dy and at least one kind of element selected from among Ta, Ti, Cu, Mn, Cr, Co, Fe, Ni, and Ga.

17. The memory device according to claim 16, wherein the perovskite-type oxide is an oxide of any one group represented by a general formula ($0.1 \leq x \leq 1$, $0 \leq z \leq 1$), which is selected from among a $Pr_{1-x}Ca_x[Mn_{1-z}M_z]O_3$ group (here, M is any element selected from among Ta, Ti, Cu, Cr, Co, Fe, Ni, and Ga); an $La_{1-x}AE_xMnO_3$ group (here, AE is any divalent alkaline-earth metal selected from among Ca, Sr, Pb, and Ba); an $RE_{1-x}Sr_xMnO_3$ group (here, RE is any trivalent rare-earth metal selected from among Sm, La, Pr, Nd, Gd, and Dy); $La_{1-x}Co_x[Mn_{1-z}Co_z]O_3$ group; a $Gd_{1-x}Ca_xMnO_3$ group; and an $Nd_{1-x}MnO_3$ group.

18. The memory device according to claim 10, wherein the second electrode includes at least one kind of a single piece of noble metal of platinum group metal, an alloy based on the noble metal, an oxide conductive substance of any element selected from among Ir, Ru, Re, and Os; and an oxide conductive substance selected from among SRO (SrRuO$_3$), LSCO ((LaSr) CoO$_3$), YBCO (YbBa$_2$Cu$_3$O$_7$).

19. The memory device according to claim 10, wherein the variable resistance element comprises a perovskite-type oxide film on the second electrode; and the first electrode includes at least one kind of a noble metal of platinum group metal, a single piece of metal or its alloy selected from among Ag, Al, Cu, Ni, Ti, and Ta, an oxide conductive substance of any element selected from among Ir, Ru, Re, and Os; and an oxide conductive substance selected from among SRO (SrRuO$_3$), LSCO ((LaSr) CoO$_3$), YBCO (YbBa$_2$Cu$_3$O$_7$).

* * * * *